US012567460B2

(12) United States Patent
Aoyagi et al.

(10) Patent No.: US 12,567,460 B2
(45) Date of Patent: Mar. 3, 2026

(54) TRACKING WORST CASE MEMORY CELLS BY SUPPRESSING TRACKING WORDLINE VOLTAGE

(71) Applicant: Taiwan Semiconductor Manufacturing Company, Ltd., Hsinchu (TW)

(72) Inventors: Yumito Aoyagi, Hsinchu (TW); Yuichiro Ishii, Kanazawa-Ku (JP); Makoto Yabuuchi, Tokyo (JP)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 262 days.

(21) Appl. No.: 18/315,619

(22) Filed: May 11, 2023

(65) Prior Publication Data

US 2024/0379154 A1     Nov. 14, 2024

(51) Int. Cl.
*G11C 16/04*     (2006.01)
*G11C 11/418*     (2006.01)
*G11C 11/419*     (2006.01)

(52) U.S. Cl.
CPC .......... *G11C 11/418* (2013.01); *G11C 11/419* (2013.01)

(58) Field of Classification Search
CPC ............................ G11C 11/418; G11C 11/419
See application file for complete search history.

(56) References Cited

U.S. PATENT DOCUMENTS

| | | | |
|---|---|---|---|
| 8,315,085 B1 | 11/2012 | Chang et al. | |
| 9,142,274 B2 * | 9/2015 | Cheng .................... | G11C 7/227 |
| 9,208,841 B2 | 12/2015 | Tao et al. | |
| 10,559,333 B2 | 2/2020 | Su et al. | |
| 11,727,972 B2 * | 8/2023 | Huang ............. | H03K 19/01742 365/230.06 |
| 2013/0121058 A1 | 5/2013 | Chiu et al. | |
| 2014/0036580 A1 | 2/2014 | Yang et al. | |
| 2015/0277770 A1 | 10/2015 | Tsai et al. | |
| 2016/0086657 A1 * | 3/2016 | Hong .................... | G11C 11/417 365/154 |
| 2019/0096457 A1 | 3/2019 | Hsu et al. | |
| 2019/0096477 A1 | 3/2019 | Clinton | |
| 2021/0257013 A1 | 8/2021 | Hong | |
| 2022/0068330 A1 | 3/2022 | Jain | |
| 2022/0359000 A1 | 11/2022 | Chen et al. | |

\* cited by examiner

*Primary Examiner* — Pho M Luu

(74) *Attorney, Agent, or Firm* — Eschweiler & Potashnik, LLC

(57) ABSTRACT

A memory macro includes a tracking wordline driver that drivers a wordline with a suppressed voltage. The suppressed voltage is made lower than the voltage used to drive wordlines in the memory array by an amount that a tracking wordline is driven with a suppressed voltage, which is a voltage that is held below the drain supply voltage. Suppressing the voltage on the tracking wordline causes tracking memory cell with average cell characteristic to emulate the slowest memory cells in a memory array. The tracking wordline with the suppressed voltage may be subjected to a mimicked wordline load. The tracking wordline with the suppressed voltage and the mimicked wordline load may also be used to enable a mimicked write drive used in write tracking. The tracking wordline with the suppressed voltage may also be used as input to a write delay circuit that times write operations.

20 Claims, 16 Drawing Sheets

READ

WRITE

1900

1801 — Pre-charge BL / TRKBL

1803 — ICLK? — no / yes

1805 — Drive WL With Voltage / TRKWL with Suppressed Voltage

1807 — Apply Mimicked Wordline Load to TRKWL

1901 — Use TRKWL To Enable A Mimicked Write Driver

1903 — Draw Down TRKBL Voltage With The Mimicked Write Driver

1813 — TRKBL Voltage Below Threshold? — no / yes

1905 — Apply Write Delay

1817 — Drive TRIG Signal

1907 — Stop Driving WL

1819 — Cause ICLK To Fall

TRACKING WORST CASE MEMORY CELLS BY SUPPRESSING TRACKING WORDLINE VOLTAGE

BACKGROUND

Semiconductor memory, such as static random access memory (SRAM) and dynamic random access memory (DRAM), have large numbers of memory cells arranged in rows and columns to form arrays. In SRAM memory, each memory cell typically includes connections to a drain supply voltage and to a source supply voltage, such as ground. A wordline connected to the pass gates of the SRAM cells in a row controls access to the memory cells in the row. One or two bitlines carry what is read or written to an accessed cell in a given column.

There is a need to optimize the timing for read and write operations. In a read operation on an SRAM memory cell the timing may relate to a period between initiating a read operation by driving a wordline and enabling a sense amplifier connected to a bitline. If the sense amplifier is enabled too soon after beginning to drive the wordline, the memory cell may be read incorrectly. But the longer sense amplifier enablement is delayed, the slower the memory. The optimal timing is affected by process, voltage, and temperature (PVT) variability. Process variability refers to characteristics of individual memory cells that vary as a result of manufacturing processes. Voltage variability refers to variations in voltage used to power the memory. Temperature variability refers to variations in the temperature at which the memory operates. The extremes of these variations that remain within the memory's design specifications may be referred to as PVT corners.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
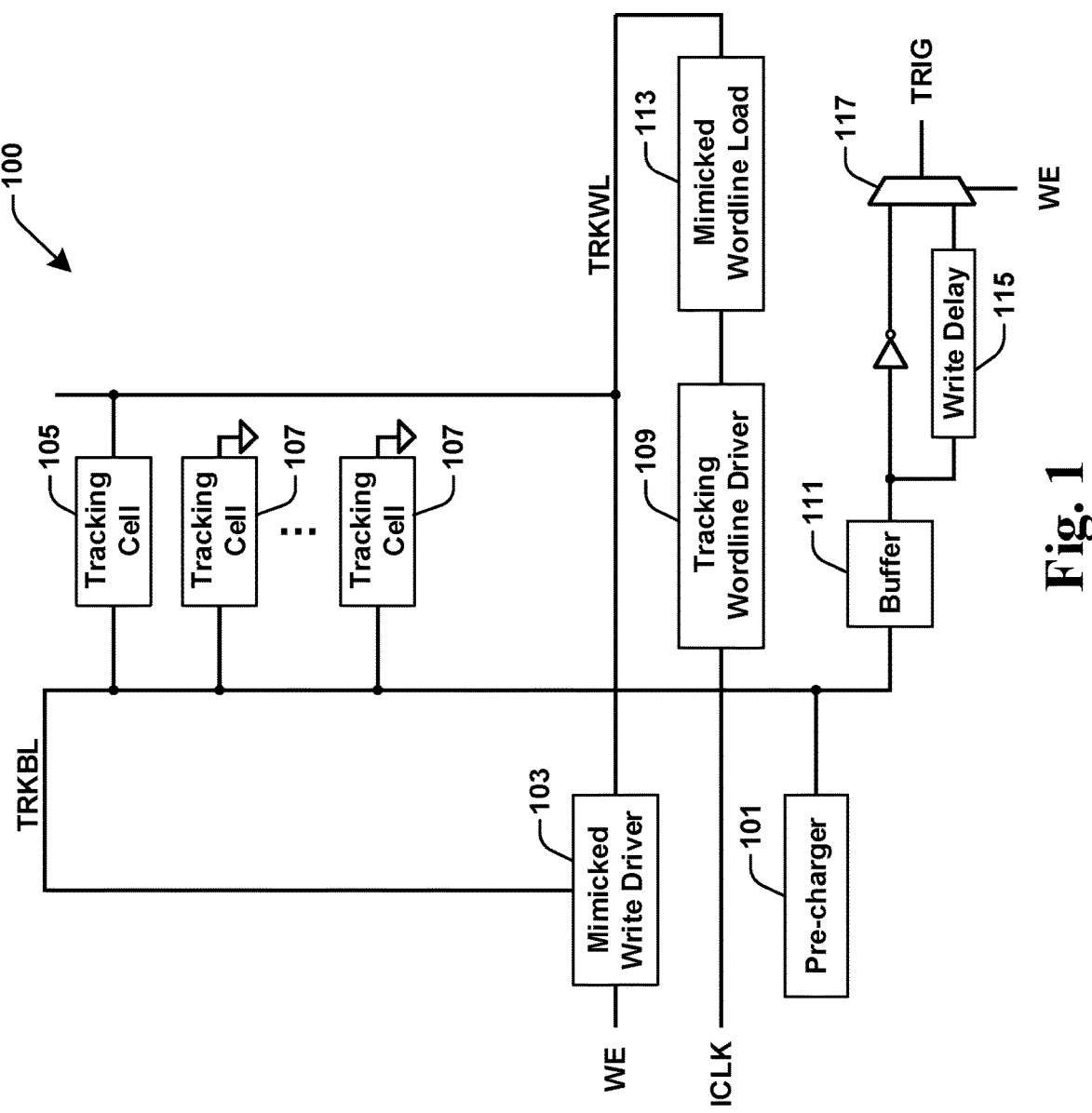
FIG. 1 is a diagram of a timing circuit for a memory device according to some embodiments.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Tracking cells are employed in a timing circuit that provides signals for controlling the timing of memory cell read operations. A tracking cell is connected to a tracking wordline and a tracking bitline. The tracking cell is at the same temperature as the memory array. The tracking wordline may be driven at the same time as a wordline of the memory array. The timing with which the tracking cell pulls down a voltage on the tracking bitline triggers a timing signal (TRIG signal). The TRIG signal would provide the correct timing for a sense amplifier enable (SAE) signal of an equivalent memory cell operating at the same temperature and with the same drain supply voltage. Due to manufacturing variations, however, all the memory cells are not equivalent to the tracking cell. To account for these variations, a delay may be added to the TRIG signal before the SAE signal is triggered. That delay may be added by a delay circuit whose input is the TRIG signal and whose output is the SAE signal. The delay may be predetermined based on an estimate of how much longer a slow memory cell may take than an average memory cell to pull down the bitline voltage. A delay made sufficiently large for the slowest PVT corner in terms of process variability adds unnecessary delay to read operations for memory cells at other PVT conditions. These unnecessary delays slow the memory operation significantly.

The present disclosure provides a memory device and a method of operation in which a tracking cell is made to model a slowest memory cell at current temperature and voltage conditions so that the delay circuit may be eliminated, and memory speed improved. It has been determined that the slowest memory cell in a memory array is slowest because its pass gate has the highest threshold voltage (Vth). A higher Vth results in a lower drain to source current ($I_{DS}$). $I_{DS}$ has been determined to vary in accordance with the following relationship in which Vgs is the gate to source voltage difference, and b and a are factors that are substantially independent of manufacturing variations:

$$I_{DS}=b*(Vgs-Vth)^a$$

According to this equation, lowering Vgs has the same effect as increasing Vth.

In a memory macro of the present disclosure, a tracking wordline is driven with a suppressed voltage, which is a voltage that is held below the driving voltage for active wordlines. The suppressed voltage is made less than the driving voltage for active wordlines so that Vgs is reduced within the tracking cells, and the tracking cells exhibit the timing of otherwise equivalent memory cells having a higher Vth. In some embodiments, the tracking wordline voltage is made less by at least a difference between Vth for the slowest memory cell in the memory array and Vth for an average memory cell in the memory array. In some embodiments, the tracking wordline voltage is made less than the driving voltage for active wordlines by four times or more a standard deviation of Vth among memory cells in the array. In some embodiments, the tracking wordline voltage is made less than the driving voltage for active wordlines by about six times the standard deviation.

The tracking wordline voltage refers to the voltage applied to a driven end of the tracking wordline. Some aspects of the present disclosure relate to a tracking wordline driver that is driven with a drain voltage provided by a drain supply and drives a tracking wordline from a driven end with a suppressed voltage, which is systematically less than the drain voltage. In some embodiments, the tracking wordline driver includes a switch circuit and a draw down circuit. The switch circuit couples the drain supply to a node from which the tracking wordline is driven. The draw down circuit couples the same node to a source supply which is at a source voltage. The drain voltage, the source voltage, and a resistance ratio between the switch circuit and the draw down circuit determine the suppressed voltage.

In some embodiments, the draw down circuit comprises a first transistor. In some embodiments, the draw down circuit comprises a plurality of first transistors connected in series. In some embodiments, the switch circuit comprises a second transistor. In some embodiments, the switch circuit comprises a plurality of second transistors connected in parallel. In some embodiments, the draw down circuit and the switch circuit share a source/drain region. In some embodiments, the source/drain region is coupled to the node from which the tracking wordline is driven. These structures reduce the effects of wiring resistances and local variations on the resistance ratio between the draw down circuit and the switch circuit and facilitates predetermining the amount of voltage suppression on the tracking wordline through the designs of these circuits.

Some aspects of the present disclosure relate to a tracking wordline that has a mimicked wordline load. The mimicked wordline load provides the tracking wordline with a similar resistance and a similar capacitance to an addressing wordline of the memory array. In some embodiments, the mimicked wordline load includes a plurality of gates coupled to the tracking wordline. In some embodiments, the gates are arranged in parallel with a row of the memory array. In some embodiments, the gates have the same pitch as the pass gates to which the addressing wordline is connected. This arrangement of gates is convenient in terms of chip design, layout, and accurate mimicking of the wordline capacitance.

In some embodiments, the tracking wordline comprises a first wire and a second wire that run parallel to the plurality of gates providing the mimicked wordline load. A connecting wire forms a bridge between the first wire and the second wire. In some embodiments, the connecting wire is at a location intermediate between two opposite ends of the plurality of gates so that the connecting wire is between two of the plurality of gates. Placing the connecting wire at an intermediate position allows the resistance of the tracking wordline to mimic more accurately the resistance of the addressing wordline which extends once across the width of the memory array but does not double back. In some embodiments, a second connecting wire is used. The number and location of the connecting wires may be adjusted to improve the resistance/capacitance match between the tracking wordline and the addressing wordline and thereby improve the accuracy of the timing signals.

Some aspects of the present disclosure relate to a mimicked write driver configured to pull down a voltage on the tracking bitline during a write tracking operation. The tracking bitline may follow a path from the mimicked write driver to the tracking cell and on to a write delay circuit. In some embodiments, the mimicked write driver is enabled by the tracking wordline. The delays of enabling the mimicked write driver through the tracking wordline and of pulling down a voltage on a far end of the tracking bitline from a near end of the tracking bitline simulate the delays of beginning a write operation on a memory cell. The write delay circuit may simulate the time it takes for a memory cell to change state. The output of the write delay circuit is a write timing signal (fall ICLK) that may be used to end a write operation on the memory cell and begin preparation for a subsequent read or write operation. In some embodiments, fall ICLK is asserted on a same wire as the TRIG signal.

Some aspects of the present disclosure relate to a write delay circuit that uses the suppressed voltage from the tracking wordline. In some embodiments, the write delay circuit includes an NMOS transistor that is switched on by the suppressed voltage supplied by the tracking wordline. In some embodiments, the write tracking circuit includes NMOS and PMOS transistors that are switched on by signals from the tracking wordline. Using the suppressed voltage in the write delay circuit allows simulation of the write speed of a slowest memory cell.

Some aspects of the present disclosure relate to a memory array that includes a near bank, a far bank, and a mimicked write driver. A first tracking cell is disposed beside a row in the near bank. A second tracking cell is disposed beside a row in the far bank. The tracking bitline connects to both the first tracking cell and the second tracking cell. The mimicked write driver has a first connection and a second connection to the tracking bitline. The first connection is a greater distance along the tracking bitline from the first tracking cell than is the second connection. The first connection may be closed while the second connection is open forcing the current from the mimicked write driver to take the longer path. The second connection may be closed allowing the current to take the shorter path. By toggling the second connection, the memory macro may provide earlier timing signals for write operations on memory cells in the near array and suitably delayed timing signals for write operations on memory cells in the far array.

Some aspects of the present disclosure relate to a memory array that includes a near bank and a far bank. A first tracking bitline connects to a first tracking cell which is beside a row in the near bank. A second tracking bitline connects to a second tracking cell which is beside a row in the far bank cell. A multiplexer toggles an output between a first input from the first tracking bitline and a second input from the second tracking bitline. The output may be used to generate the TRIG signal or fall ICLK. The tracking wordline may be connected to both the first tracking bitline and the second tracking bitline. By selecting between the first tracking bitline and the second tracking bitline, the memory macro may provide earlier timing signals for operations on memory cells in the near array and suitably delayed timing signals for operations on memory cells in the far array.

FIG. 1 provides a circuit diagram for a timing circuit 100 according to some embodiments. The timing circuit 100 is part of a memory macro in a memory device. The timing circuit 100 includes a tracking wordline TRKWL and a tracking bitline TRKBL. The tracking bitline TRKBL is connected to an active tracking cell 105 and passive tracking cells 107. The active tracking cell 105 is connected to the tracking wordline TRKWL but the passive tracking cells 107 are not.

A pre-charger 101 raises the tracking bitline TRKBL to a drain supply voltage $V_{DD}$ prior to a read operation. A read operation begins when the ICLK signal is asserted. When the ICLK signal is asserted, the pre-charger 101 is cut off from the tracking bitline TRKBL and the tracking bitline TRKBL is allowed to float. Also in response to the ICLK signal, a tracking wordline driver 109 begins to drive the tracking wordline TRKWL with the suppressed voltage. A mimicked wordline load 113 attenuates the signal on the tracking wordline TRKWL as it propagates from the tracking wordline driver 109 to the active tracking cell 105. Within the active tracking cell 105, the tracking wordline TRKWL acts on a pass gate to close a connection between the tracking bitline TRKBL and a source voltage, at which point the active tracking cell 105 begins pulling down the voltage on the tracking bitline TRKBL. The tracking bitline TRKBL is connected to a buffer 111 and the buffer 111 is connected to a multiplexer 117. Once the voltage on the tracking bitline TRKBL has dropped sufficiently to flip the output of the buffer 111 the TRIG signal is asserted through the multiplexer 117.

The timing circuit 100 is also configured to track write operations. A mimicked write driver 103 is connected to the tracking wordline TRKWL on a far side of the mimicked wordline load 113 from the tracking wordline driver 109. The mimicked write driver 103 is also connected to the tracking bitline TRKBL. If the signal WE (write enable) is asserted, the mimicked write driver 103 will begin pulling down the voltage on the tracking bitline TRKBL when the attenuated signal on the tracking wordline TRKWL reaches the mimicked write driver 103. If the signal WE is asserted, the multiplexer 117 forces the output of the buffer 111 through the write delay circuit 115. The write delay circuit 115 adds a delay to the assertion of the TRIG signal to the time the voltage on the tracking bitline TRKBL has dropped sufficiently to flip the output of the buffer 111.

The timing circuit 100 illustrates a single active tracking cell 105 and a few passive tracking cells 107. In some embodiment, the active tracking cell 105 and the passive tracking cells 107 are in a column that is on one side of a memory array and the total number of the active tracking cells 105 and the passive tracking cells 107 is equal to the number of rows in the memory array. All of these may be connected to the tracking bitline TRKBL. The number of rows in the memory array may be 128 or more, e.g., 256. In some embodiments, the column contains eight or more active tracking cells 105 connected to the tracking wordline TRKWL. Using eight or more active tracking cells 105 averages out effects on the timing that may result from process induced variations in the active tracking cells 105.

Figure 2:
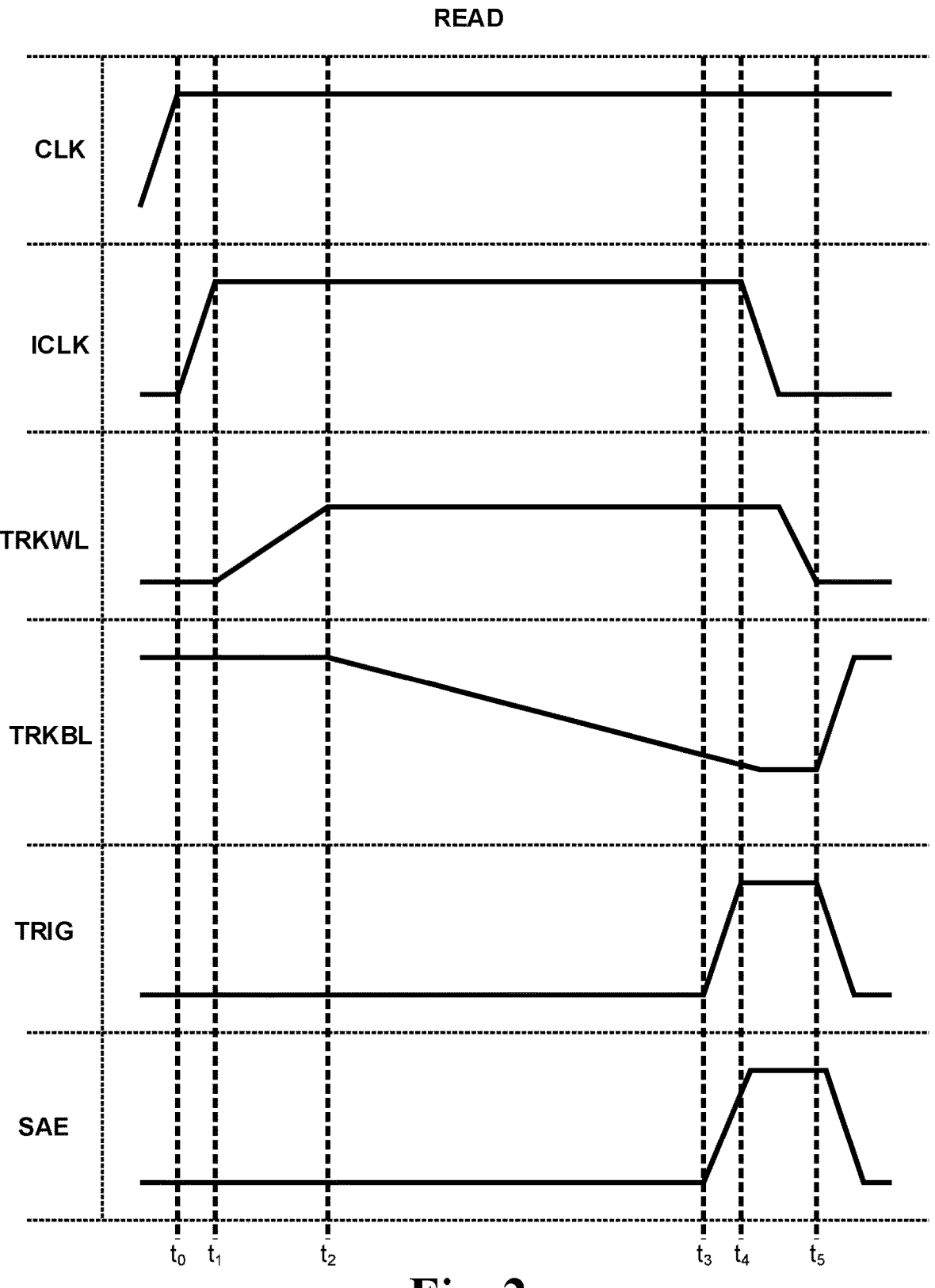
FIG. 2 illustrates wave forms for a read operation using a timing circuit according to some embodiments.

FIG. 2 illustrates waveforms for the timing circuit 100 during a read operation. At time to, the ICLK signal is driven in response to rising of a global clock signal CLK. At time $t_1$, the ICLK signal is asserted and the voltage on the tracking wordline TRKWL begins to rise. Between time $t_1$ and $t_2$, a voltage on the tracking wordline TRKWL is rising. The rise is extended slowed by the mimicked wordline load 113 (see FIG. 1). The extent of the rise is limited by the tracking wordline driver 109.

At $t_2$, the voltage on the tracking wordline TRKWL has risen sufficiently for the active tracking cells 105 to begin pulling down the voltage on the tracking bitline TRKBL. At $t_3$, the voltage on the tracking bitline TRKBL has fallen sufficiently to initiate the TRIG signal. The SAE signal is asserted almost immediately after the TRIG signal is asserted. In some embodiments, the SAE signal is connected so as to follow the TRIG signal with only wiring delays, which are kept low. Accordingly, the SAE begins to rise before the TRIG signal is fully asserted. In some embodiments, the SAE signal begins to rise as soon as the TRIG signal begins to rise.

The TRIG signal is asserted at $t_4$. In conjunction with assertion of the TRIG signal, the ICLK signal begins to fall. The fall of the ICLK signal initiates the fall of the voltage on the tracking wordline TRKWL. The fall of the voltage on the tracking wordline TRKWL causes the TRIG signal to fall at $t_5$. In some embodiments, the fall of the voltage on the tracking wordline TRKWL triggers the pre-charger 101, whereby the voltage on the tracking bitline TRKBL begins to rise at about $t_5$.

Figure 3:
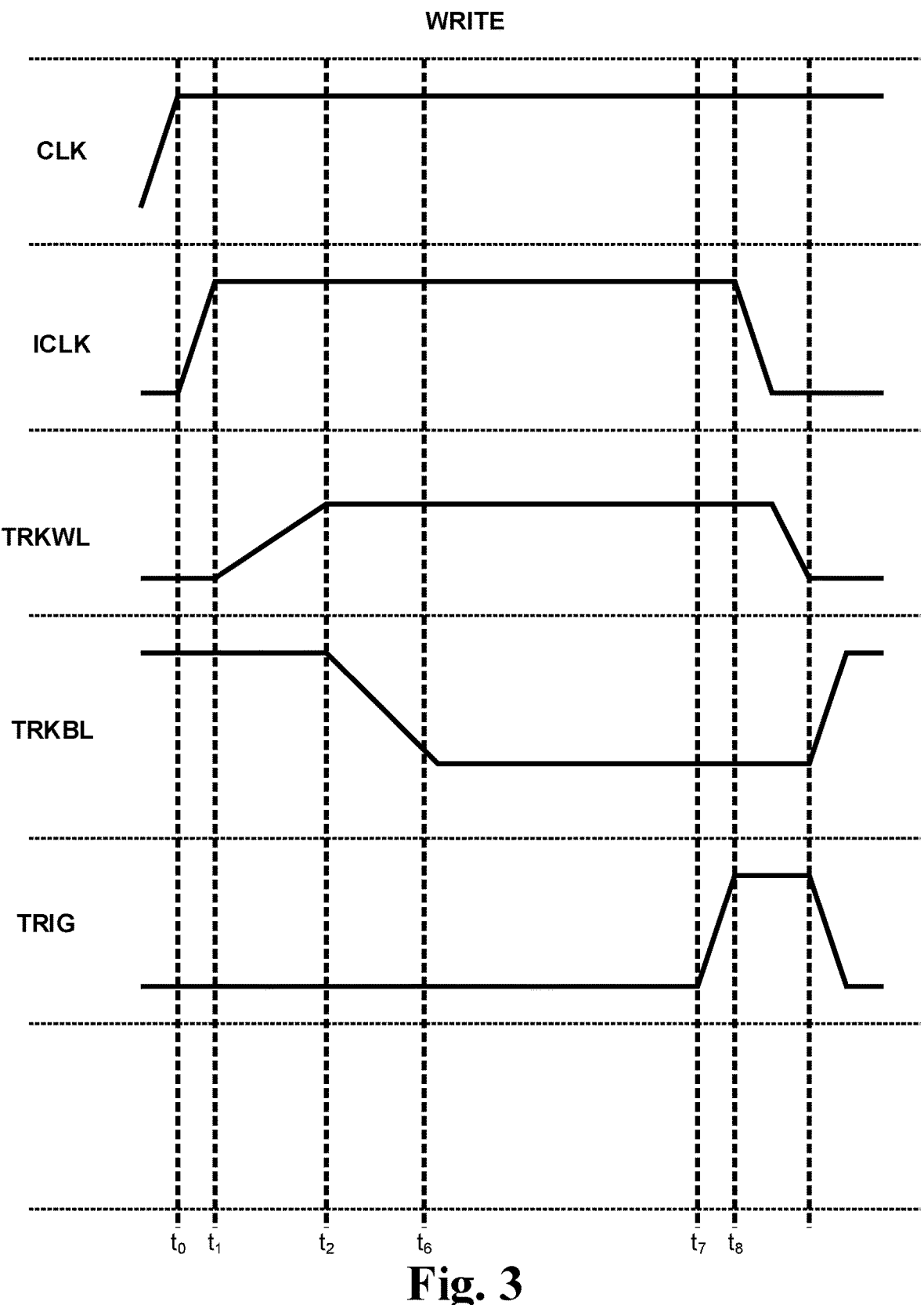
FIG. 3 illustrates wave forms for a write operation using a timing circuit according to some embodiments.

FIG. 3 illustrates waveforms for the timing circuit 100 during a write operation. At $t_2$, the voltage on the tracking wordline TRKWL has risen sufficiently for the mimicked write driver 103 (see FIG. 1) to begin pulling down the voltage on the tracking bitline TRKBL. The tracking write driver 103 pulls down the voltage on the tracking bitline TRKBL more rapidly than do the active tracking cells 105. At $t_6$, the tracking bitline TRKBL has been pulled down sufficiently to flip the output of the buffer 111. This is approximately the time at which a write operation begins for the slowest memory cell in the memory array. The interval from $t_6$ to $t_7$ is added by the write delay circuit 115 and is approximately the time for a write operation to complete in the slowest memory cell. At $t_7$, the TRIG signal is initiated. In response to the TRIG signal during a write operation, a voltage pulse on a wordline (not shown) begins to fall.

Figure 4:
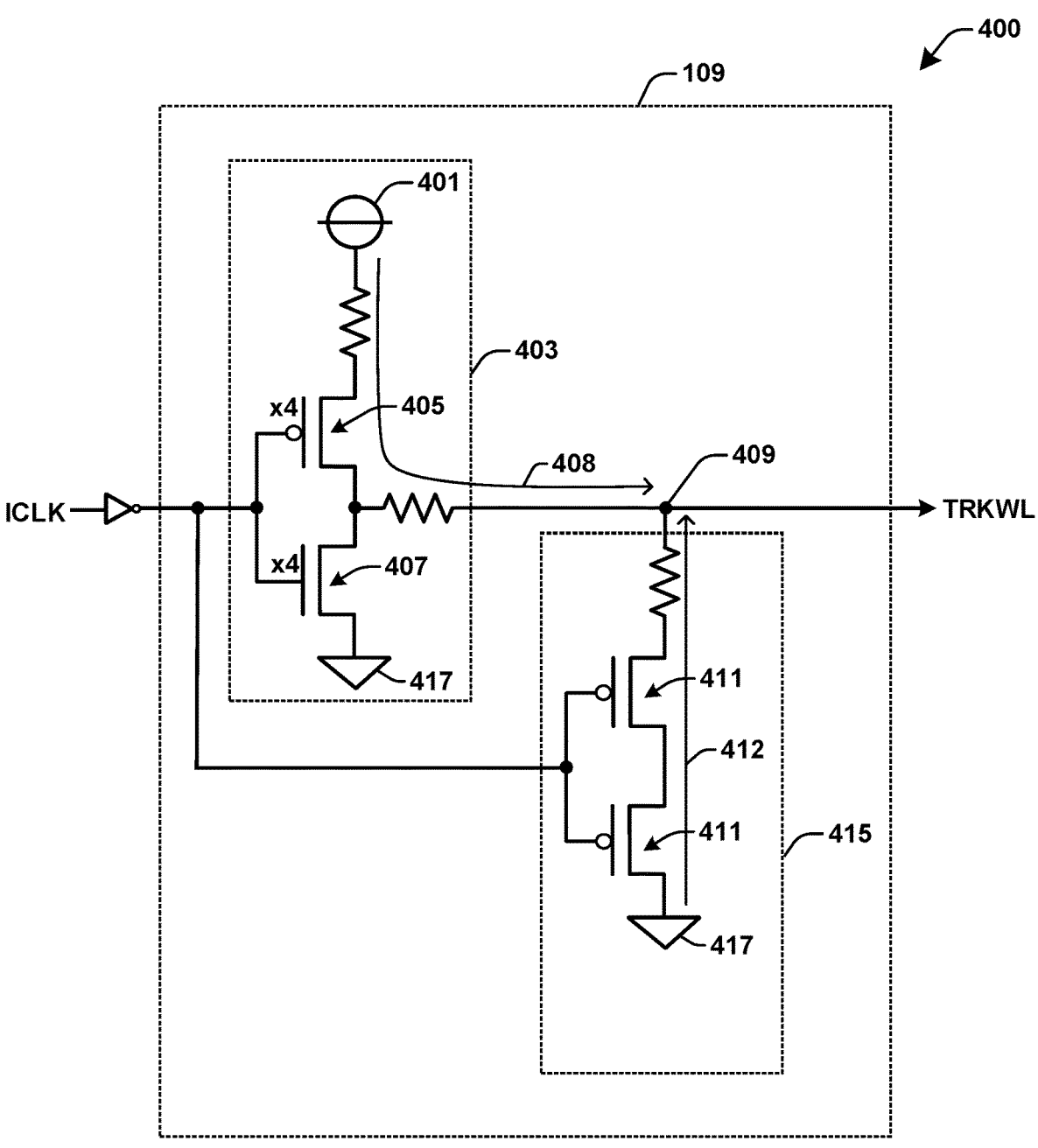
FIG. 4 is a circuit diagram of a mimicked write driver according to some embodiments.

FIG. 4 provides a circuit diagram 400 of the tracking wordline driver 109 in accordance with some embodiments. The tracking wordline driver 109 of the circuit diagram 400 includes a switch circuit 403 and a draw down circuit 415. When ICLK is not asserted, the tracking wordline TRKWL is connect to a source supply 417 through transistors 407. When ICLK is asserted, the switch circuit 403 forms a first current path 408 which is between a drain supply 401 and a node 409 to which the tracking wordline TRKWL is connected and from which the tracking wordline TRKWL is driven. Also, when ICLK is asserted, the draw down circuit 415 forms a second current path 412 which is between the source supply 417 and the node 409. A current from the drain supply 401 along the first current path 408 will be divided between the tracking wordline TRKWL and the second current path 412. A voltage on the node 409, which will be the suppressed voltage, will be a value intermediate between whose of the drain supply 401 and the source supply 417. The extent of the voltage suppression will be determined by the relative resistances of the first current path 408 and the second current path 412.

In accordance with some embodiments, the first current path 408 includes a plurality of first transistors 405 in parallel and the second current path 412 includes a plurality of second transistors 411 in series. In some embodiments, the first transistors 405 and the second transistors 411 are either all NMOS or all PMOS. In some embodiments, they are all PMOS. Making all the first transistors 405 and all of the second transistors 411 of one type reduces the effects of manufacturing variability and helps assure that the tracking wordline driver 109 suppresses the voltage in accordance with a predetermined specification. The wiring resistances may be kept low so that the resistances of the first current path 408 and the second current path 412 are dominated by the transistors. The predetermined specification may be, for example, to make the suppressed voltage lower than a memory drain voltage $V_{DDM}$ by six time a standard deviation of the threshold voltages of the pass gate transistors in a memory array. The standard deviation and the performance of the tracking wordline driver 109 may be determined using simulations or data. In the illustrated example, the first current path 408 has four first transistors 405 in parallel and the second current path 412 has two second transistors 411 in parallel, however, this is only an example. The number, type, and arrangement of transistors in each path may be varied to provide the node 409 with whatever voltage suppression is specified.

Figure 5:
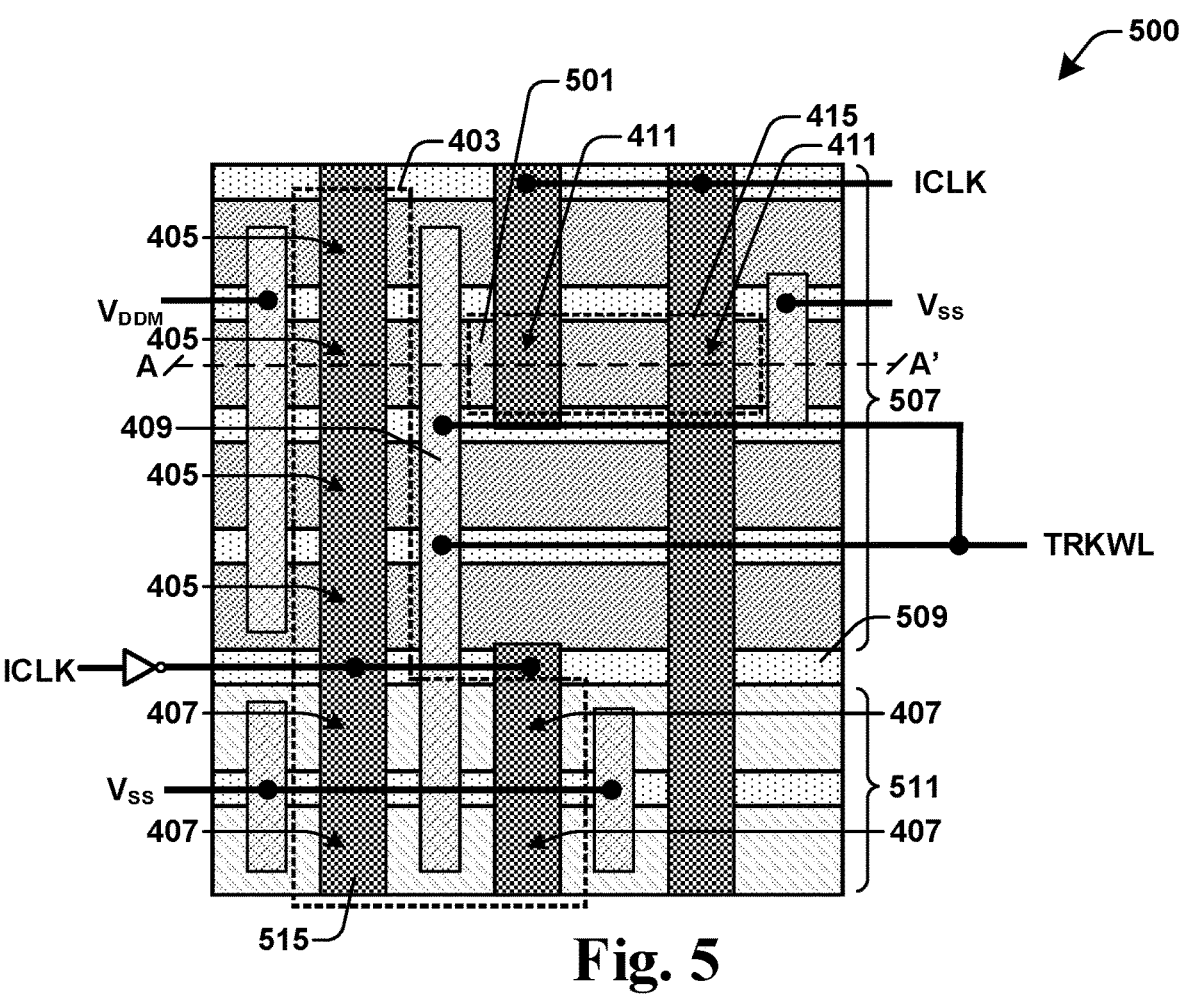
FIG. 5 illustrates a layout for an integrated circuit providing a mimicked write driver according to some embodiments.
Figure 6:
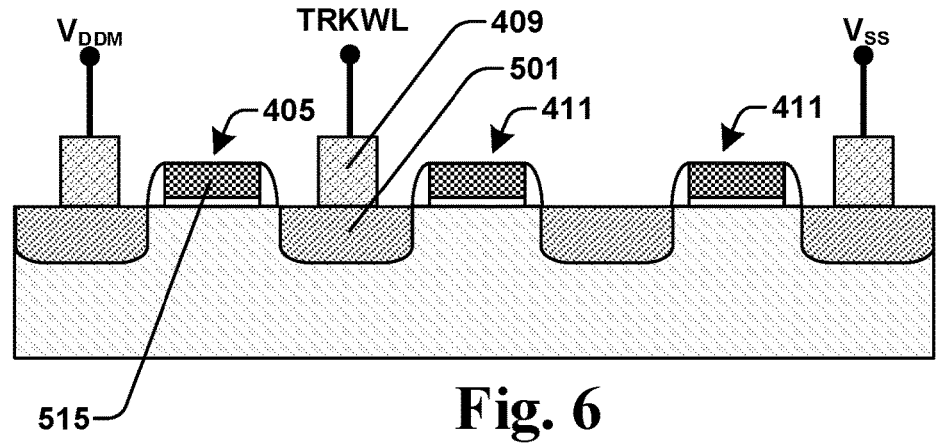
FIG. 6 illustrates a cross-sectional view along the line A-A' of FIG. 5.

FIG. 5 illustrates a layout of an integrated circuit 500 in accordance with some embodiments with components and connections corresponding to the circuit diagram 400 of FIG. 4. FIG. 6 illustrates a cross-sectional view through the line A-A' of FIG. 5. The integrated circuit 500 includes a PMOS region 507 and an NMOS region 511. Four first transistors 405 are arranged and connected in parallel to form a column within the PMOS region 507. A single gate strip 515 runs vertically through the column and provides gate electrodes for all four first transistors 405. Two second transistor 411 are in a row with one of the first transistors 405. All the transistors in the row are between two adjacent isolation structures 509. A source/drain region 501 is shared between one of the first transistors 405 and one of the second transistors 411. The switch circuit 403 and the draw down circuit 415 converge on a conductive strip which provides the node 409. This compact structure avoids wiring that could affect the relative resistances between the first current path 408 and the second current path 412 (see FIG. 4). This structure also reduces the extent to which local variations of the type that result from manufacturing processes affect their relative resistances.

Figure 7:
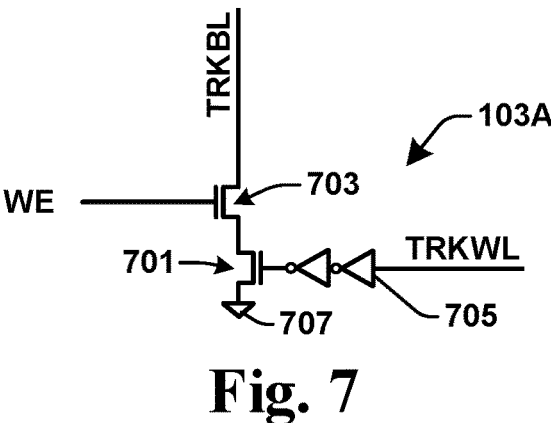
FIG. 7 is a circuit diagram for a mimicked wordline driver according to some embodiments.

FIG. 7 provides a circuit diagram for a write driver 103A, which is the write driver 103 in accordance with some embodiments. The write driver 103A includes a first transistor 701 that is switched on through the tracking wordline TRKWL and a second transistor 703 that is switched on by the WE signal. The first transistor 701 and the second transistor 703 are arranged in series so that the tracking bitline TRKBL is coupled to a source supply 707 when both the WE signal and the tracking wordline TRKWL are asserted. A pair of inverters 705 may be used between the tracking wordline TRKWL and the first transistor 701. The pair of inverters 705 buffer the signal from the tracking wordline TRKWL so that the voltage applied to the first transistor 701 may be higher than the suppressed voltage.

Figure 8:
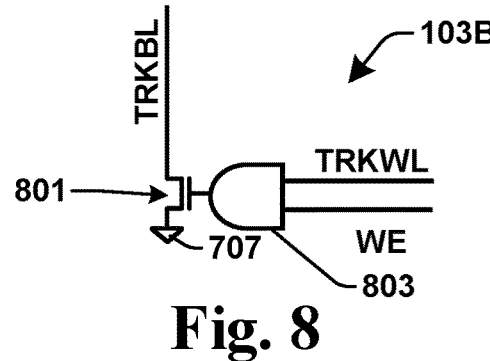
FIG. 8 is a circuit diagram for a mimicked wordline driver according to some other embodiments.

FIG. 8 provides a circuit diagram for a write driver 103B, which is the write driver 103 in accordance with some other embodiments. In the write driver 103B, the transistor 801 selectively couples the tracking bitline TRKBL to the source supply 707 according to the output of an AND gate 803 for which the WE signal and the tracking wordline TRKWL are inputs.

Figure 9:
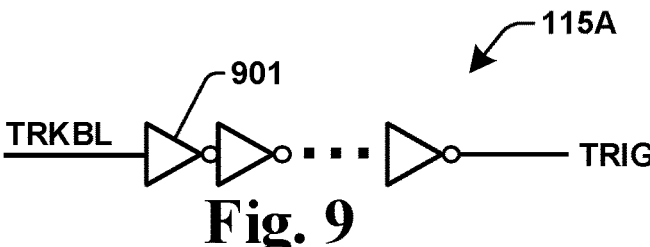
FIG. 9 is a circuit diagram for a write delay circuit according to some embodiments.

FIG. 9 provides a circuit diagram for a write delay circuit 115A, which is the write delay circuit 115 in accordance with some embodiments. The write delay circuit 115A includes inverters 901 in series. In some embodiments, the write delay circuit 115A include ten or more of the inverters 901 in series.

Figure 10:
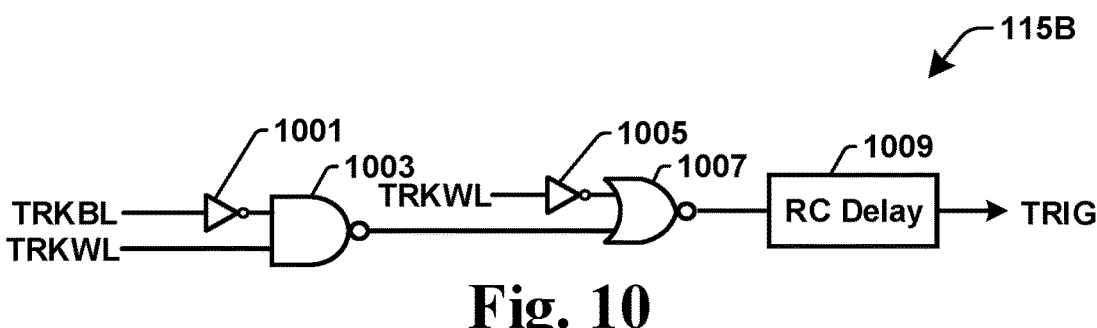
FIG. 10 is a circuit diagram for a write delay circuit according to some other embodiments.
Figure 11:
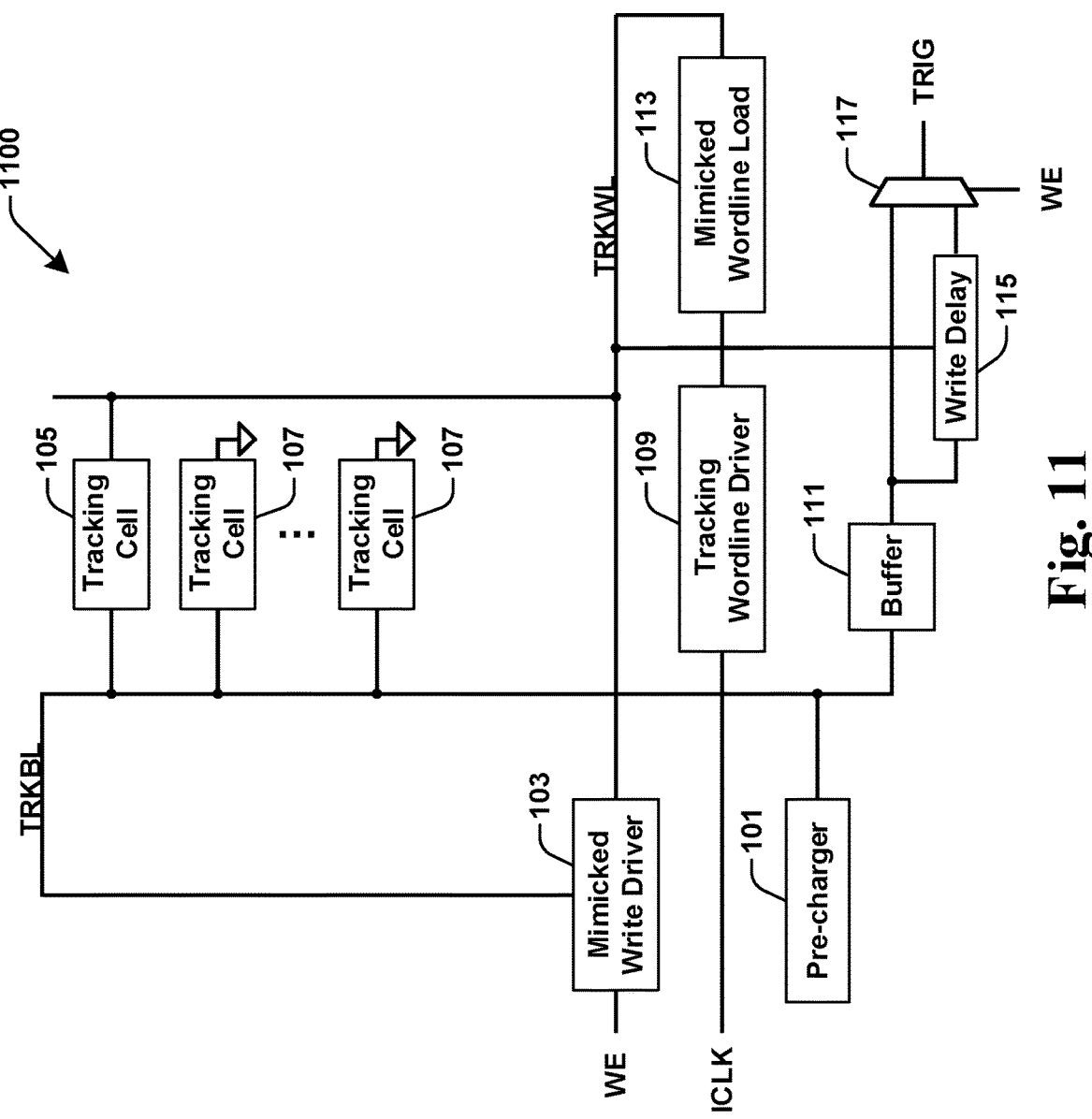
FIG. 11 is a diagram of a timing circuit for a memory device according to some other embodiments.

FIG. 10 provides a circuit diagram for a write delay circuit 115B, which is the write delay circuit 115 in accordance with some other embodiments. The write delay circuit 115B uses the suppressed volage of the tracking wordline TRKWL. FIG. 11 provides a circuit diagram 1100, which is a modification of the timing circuit 100 showing how the tracking wordline TRKWL may be connected to the write delay circuit 115. Applying the suppressed volage of the tracking wordline TRKWL to gates in the write delay circuit 115 may allow that circuit to more accurately emulate the write delay of a slowest memory cell.

As shown in FIG. 10, the write delay circuit 115B includes a NAND gate 1003, a NOR gate 1007, and an RC delay circuit 1009. The inputs for the NAND gate 1003 are the tracking wordline TRKWL and an inverted signal from the tracking bitline TRKBL supplied by an inverter 1001. The inputs for the NOR gate 1007 are the output of the NAND gate 1003 and an inverted signal from the tracking wordline TRKWL supplied by an inverter 1005. The NAND gate 1003 and the NOR gate 1007 track the transistor-dependent delays of a memory cell during a write operation. The RC delay circuit 1009 emulates additional delays caused by the resistances and capacitances of wiring. Delay may be simulated with logic provided by multiple transistors. Delay may also be simulated with wiring. In some embodiments, the RC delay circuit 1009 uses wiring as the source of delay to better emulate the type of delay being mimicked. In accordance with some embodiments, the write delay circuit 115B includes at least one NMOS transistor with a gate electrode coupled to the suppressed voltage on the tracking wordline TRKWL.

Figure 12A:
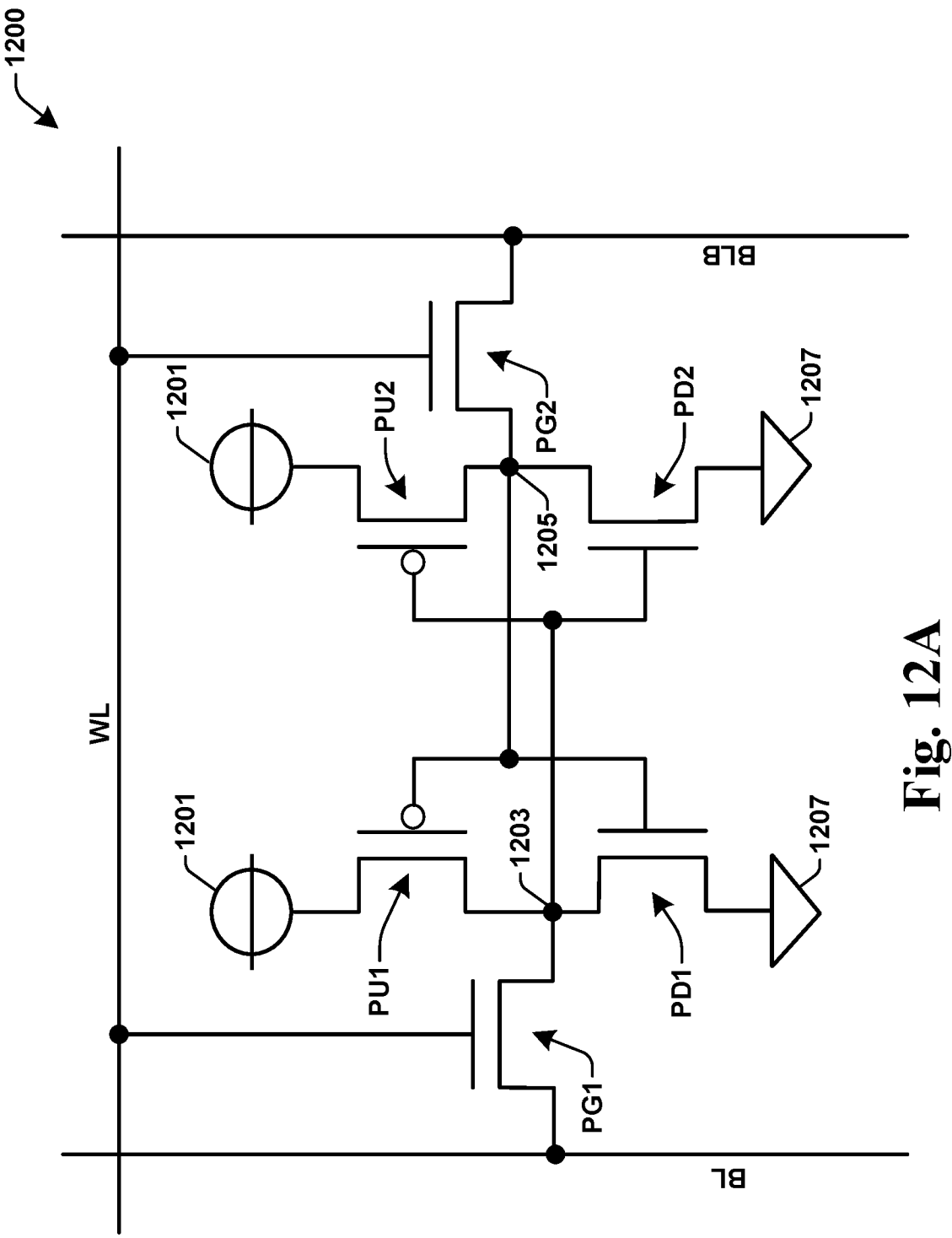
FIG. 12A is a circuit diagram for a memory cell according to some embodiments.

FIG. 12A provides a circuit diagram for a memory cell 1200, which is an example of the type of memory cell than may be tracked by a memory macro of the present disclosure. The memory cell 1200 is a six transistor (6T) SRAM memory cell. Alternatively, the memory cell could be a two-transistor two-resistor (2T-2R) SRAM cell, a four-transistor (4T) SRAM cell, an eight-transistor (8T) SRAM cell, the like, or some other suitable type of memory cell.

The memory macros of the present disclosure may also by applied to DRAM memory cells.

The memory cell 1200 contains a first storage node 1203 and a second storage node 1205 and is addressed by a wordline WL, a first bitline BL, and a second bitline BLB. A first pass gate transistor PG1 coupled to the wordline WL selectively couples the first bitline BL to the first storage node 1203. A second pass gate transistor PG2 coupled to the wordline WL selectively couples second bitline BLB to the second storage node 1205. A first pull up transistor PU1 selectively couples the first storage node 1203 to a drain supply 1201. A second pull up transistor PU2 selectively couples the second storage node 1205 to the drain supply 1201. A first pull down transistor PD1 selectively couples the first storage node 1203 to a source supply 1207. A second pull down transistor PD2 selectively couples the second storage node 1205 to the source supply 1207.

A write time for the memory cell 1200 is primarily determined by the performance of the pass gate transistor PG1, which is an NMOS transistor, and the first pull up transistor PU1, which is a PMOS transistor. In accordance with some embodiments, the write delay circuit 115B of FIG. 10 includes a PMOS transistor and an NMOS transistor with a gate terminal connected to the tracking wordline TRKWL.

Figure 12B:
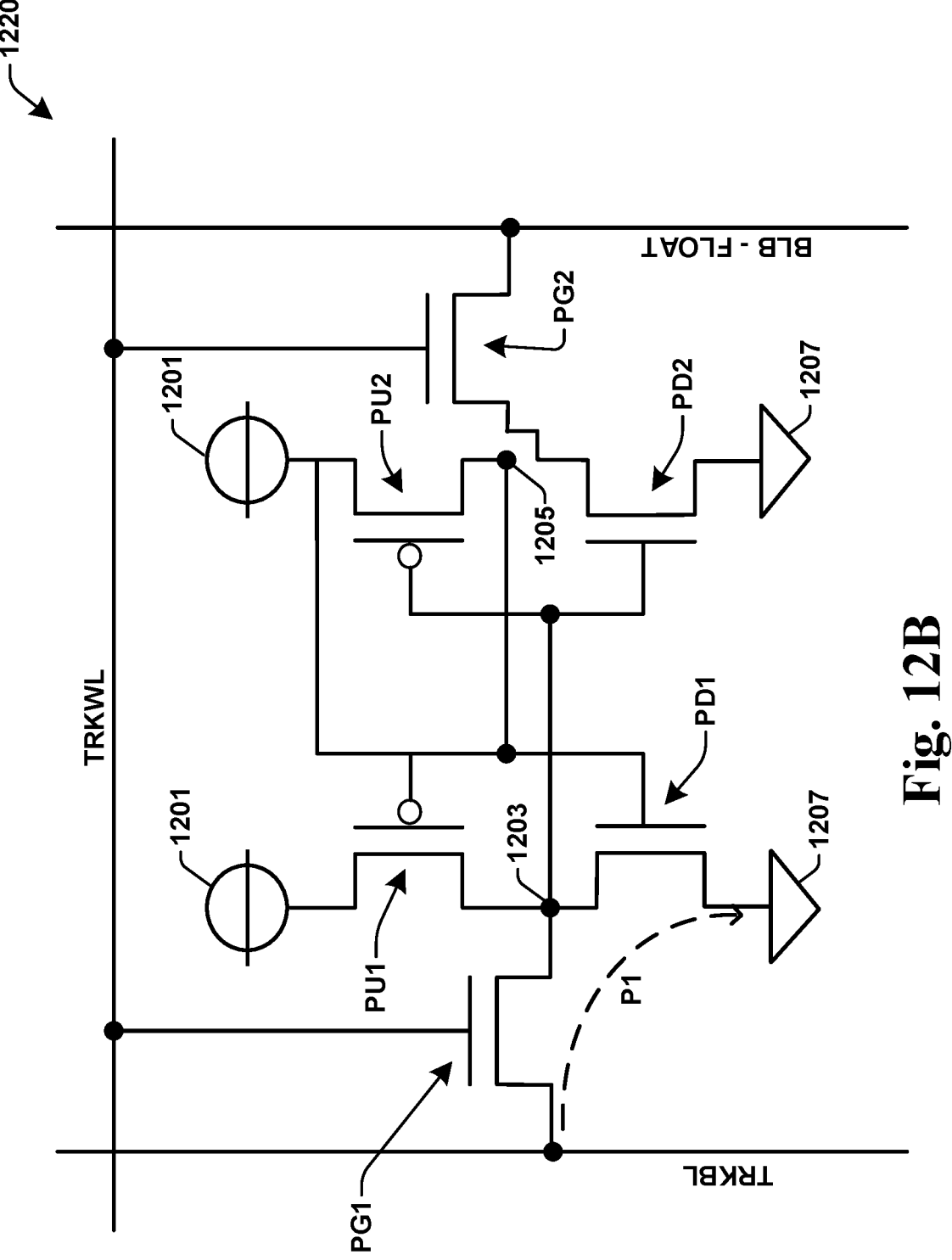
FIG. 12B is a circuit diagram for a tracking cell according to some embodiments.

FIG. 12B provides a circuit diagram for an active tracking cell 1220 which is an example for the active tracking cell 105. The active tracking cell 1220 may have the same layout and components as the memory cell 1200 of FIG. 12A with a few modifications that fix the state of the active tracking cell 1220. In particular, the gates of the first pull up transistor PU1 and the first pulldown transistor are coupled to the drain supply 1201 so that the first pull up transistor PU1 remains open and the first pulldown transistor PD1 remains closed. The second storage node 1205 is also directly coupled to the drain supply 1201. The terminals of the second pass gate transistor PG2 and the second pulldown transistor PD2 are disconnected from the second storage node 1205 and are directly connected to one another. The second bitline BLB for the active tracking cells 1220 may be allowed to float. In this configuration, if the first pass gate transistor PG1 is closed by asserting the tracking wordline TRKWL, current will flow from the tracking bitline TRKBL to the source supply 1207 through the first pass gate transistor PG1 and the first pulldown transistor PD1 along the path P1.

Figure 13:
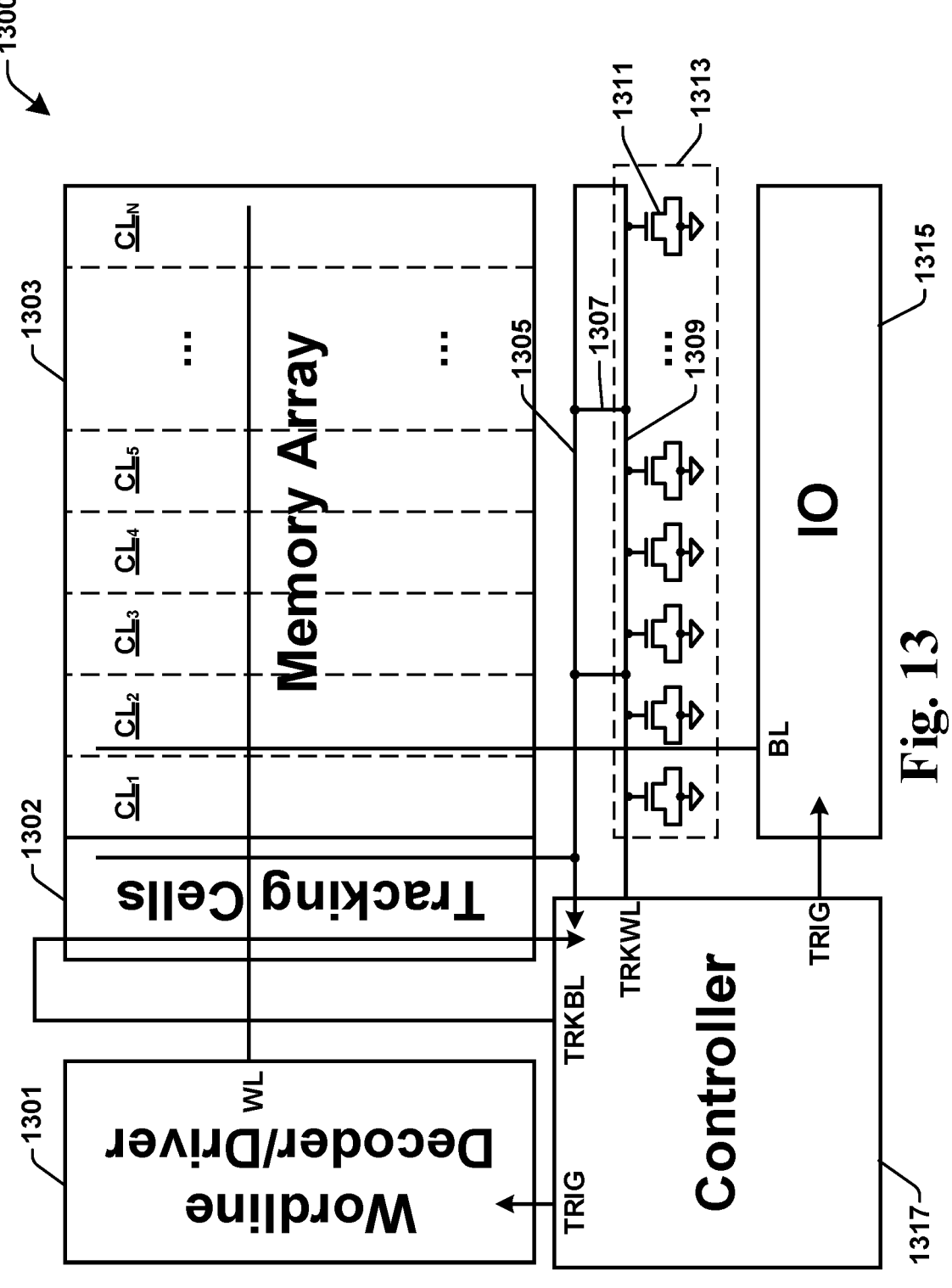
FIG. 13 illustrates a layout for a memory device according to some embodiments.

FIG. 13 illustrates a layout of a memory device 1300 that includes memory macro according to the present disclosure. The memory device 1300 includes a memory array 1303, a wordline driver/decoder 1301, a controller 1317, and an IO circuit 1315. The memory array 1303 includes an array of memory cells, such as the memory cell 1200 of FIG. 12A, arranged in rows and columns. The columns are numbered $CL_1$ to $Cl_N$, where N is the number of columns. In some embodiments, N is in the range of 128 to 512, which 256 being a typical number of columns. In some embodiments, the number of rows is the same as the number of columns although the number of rows may be larger or smaller.

The wordline driver/decoder 1301 is an active wordline driver in that it drives a wordline WL used for addressing memory cells in the memory array 1303. The wordline driver/decoder 1301 drives the wordline WL with a memory drain voltage $V_{DDM}$. The wordline driver/decoder 1301 may be supplied with a drain voltage $V_{DD}$. In some embodiments, the memory device 1300 uses read assist select (RAS). RAS makes the memory drain voltage $V_{DDM}$ less than the drain voltage $V_{DD}$ in order to save power. When RAS is in use, $V_{DDM}$ is made relatively close to the threshold voltage of the slowest memory cell in the memory array 1303, which increases the sensitivity of the memory cell operation speeds to process induced variations in the memory cells. The systems and methods of the present disclosure accommodate the slowest memory cells while increasing the speed of read operations on faster memory cells. This advantage is accentuated in memory devices that use RAS.

For a memory device with RAS, the tracking wordline driver 109 (see FIG. 1) may be supplied with either the drain voltage $V_{DD}$ or the memory drain voltage $V_{DDM}$. In the case where the tracking wordline driver 109 follows the circuit diagram 400 of FIG. 4, the relative resistances of the first current path 408 and the second current path 412 are designed according to whether the drain supply 401 will be at the drain voltage $V_{DD}$ or the memory drain voltage $V_{DDM}$. If the drain supply 401 is to be at the memory drain voltage $V_{DDM}$, the draw down circuit 415 will be designed to hold the suppressed voltage below the voltage of the drain supply 401 by $\Delta V_{th}$, which is a difference between a highest threshold voltage among the pass gate transistors in a memory array and an average threshold voltage for the pass gate transistors in the memory array. If the drain supply 401 is to be at the drain voltage $V_{DD}$, the draw down circuit 415 is designed to hold the suppressed voltage below the voltage of the drain supply 401 by $\Delta V_{th}$ plus an additional amount that accounts for the difference between the drain voltage $V_{DD}$ and the memory drain voltage $V_{DDM}$. In either case, the tracking wordline TRKWL is driven with a lower voltage that the wordline WL.

Returning to FIG. 13, a tracking cell array 1302 comprises active tracking cells 105 and passive tracking cells 107 (see FIG. 1) and is disposed next to one of the columns $CL_1$ to $Cl_N$, e.g., to the left of column $CL_1$. The tracking cell array 1302 may have the same number of rows as the memory array 1303. The tracking bitline TRKBL may connect to all the tracking cells in the tracking cell array 1302. In some embodiment, the tracking bitline TRKBL connects to the farthest tracking cell before doubling back to mimic the RC delay of the bitline BL more accurately.

A load mimicking array 1313 is disposed below the memory array 1303 and has load-mimicking gates 1311 corresponding to the first pass gate transistors PG1 and the second pass gate transistors PG2 of the memory cells (see FIG. 12A). The load mimicking array 1313 corresponds to the mimicked wordline load 113 (see FIG. 1). In some embodiments the load-mimicking gate 1311 are aligned in a row running parallel to the rows of the memory array 1303. In some embodiments, the is at least one load-mimicking gate 1311 under each of the columns $CL_1$ to $Cl_N$. In some embodiments there are two load-mimicking gates 1311 under each of the columns $CL_1$ to $Cl_N$.

The controller 1317 may contain components of the timing circuit 100 (see FIG. 1) such as the mimicked write driver 103, the pre-charger 101, the tracking wordline driver 109, and the write delay circuit 115. The controller 1317 provides the TRIG signal to the IO circuit 1315. The IO circuit 1315 has a sense amplifier (not shown) for each bitline BL. There is one bitline BL for each of the columns $CL_1$ to $Cl_N$.

The tracking wordline TRKWL may include a first wire 1309 that connects to each of the load-mimicking gates 1311 in the load mimicking array 1313. The tracking wordline TRKWL may also include a second wire 1305 that doubles back and one or more connecting wires 1307 that bridge between the first wire 1309 and the second wire 1305. The number and locations of the connecting wires 1307 may be adjusted so that the resistance of the tracking wordline TRKWL matches the resistance of the wordline WL. The wordline WL makes one traversal across the memory array 1303 so its resistance may be better mimicked if the tracking wordline TRKWL has a current path that does not require a full trip back and forth across the memory array 1303. Suitable locations for the one or more connecting wires 1307 are typically between the ends of the memory array 1303, i.e., between the first and last load-mimicking gates 1311 in the load mimicking array 1313.

In some embodiments, either the first wire 1309, the second wire 1305, or both is in a different metal interconnect level (not shown) from the wordlines WL. The difference in metal interconnect level may be related to a difference in wire dimensions and resistances. Adjustments to the positions of the one or more connecting wires 1307 may account for these differences as well.

Figure 14:
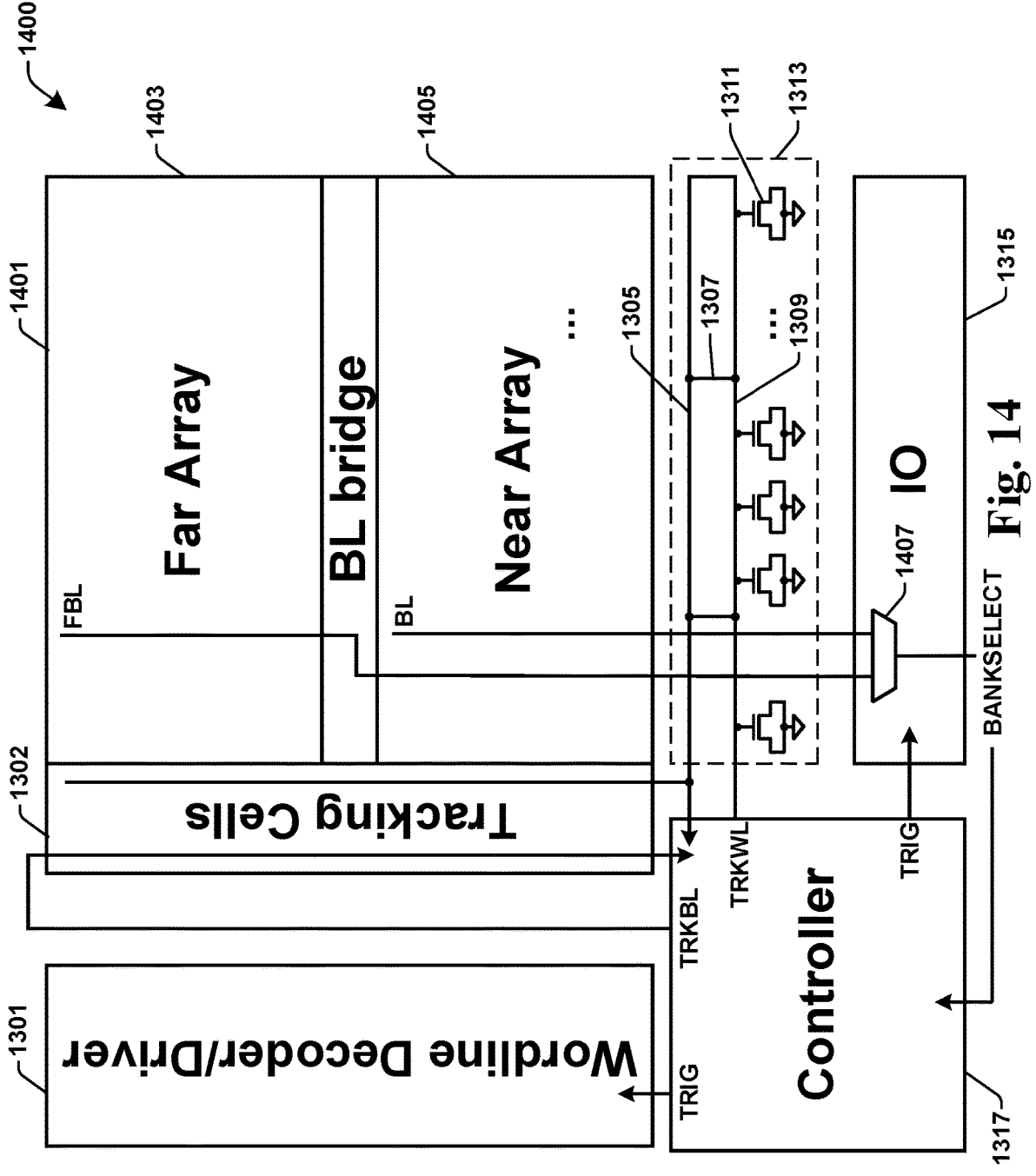
FIG. 14 illustrates a layout for a memory device according to some other embodiments.

FIG. 14 illustrates a layout of a memory device 1400 that includes another memory macro according to the present disclosure. The memory device 1400 has many of the same components as the memory device 1300 of FIG. 13. The memory device 1400 has a memory array 1401 that includes a near bank 1405 and a far bank 1403. A multiplexer 1407 selectively connects the IO circuit 1315 to one of the bitline BL, which serves the near bank 1405, of the flying bitline FBL, which serves the far bank 1403. The greater distance of the memory cells in the far bank 1403 makes read and write operations slower as compared to read and write operations carried out on memory cells in the near bank 1405. Therefore, it is desirable to have a timing circuit that takes into account these differences so that the operations on the memory cells in the near bank 1405 can be carried out faster.

Figure 15:
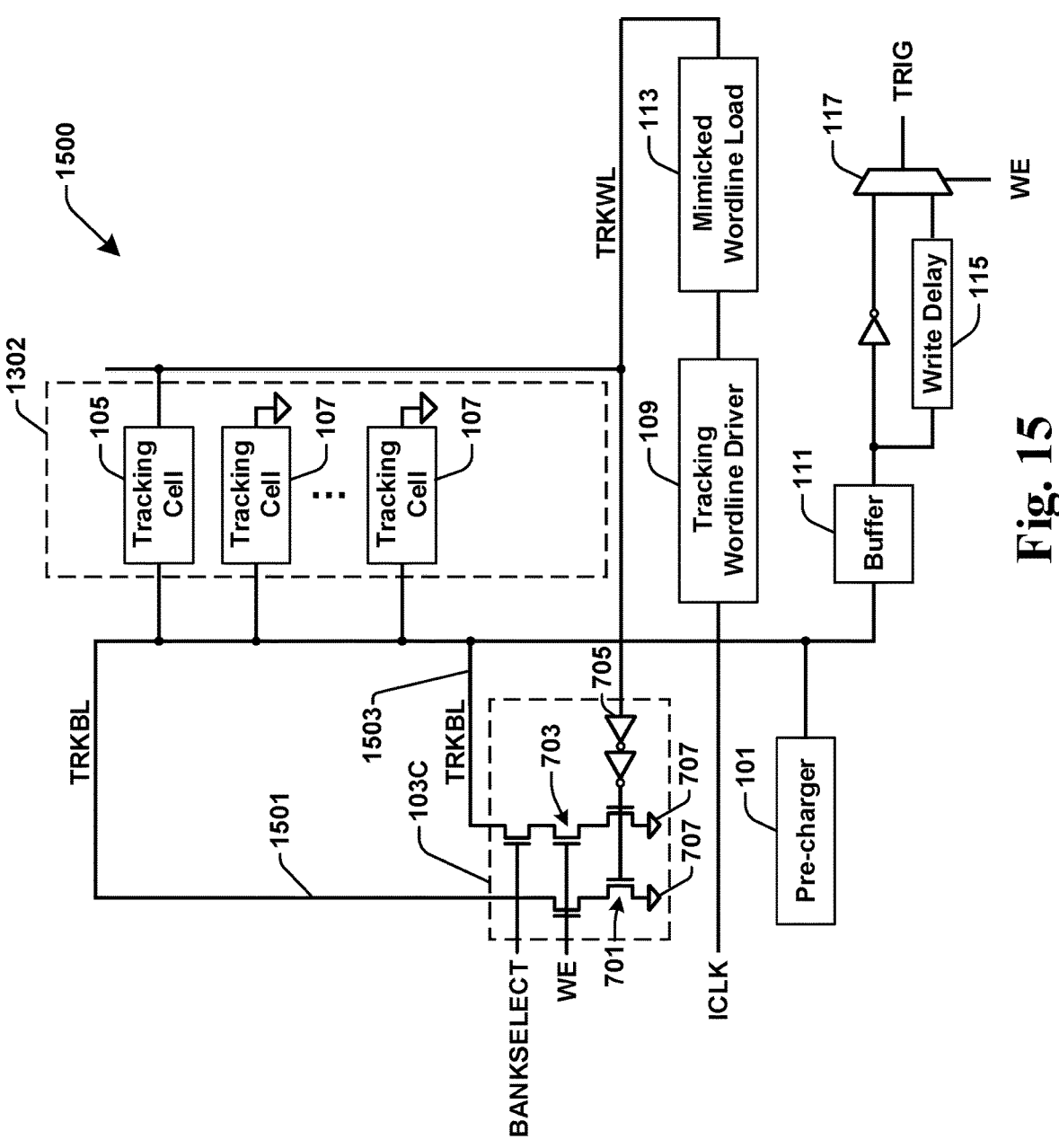
FIG. 15 is a circuit diagram for a timing circuit according to some other embodiments.

FIG. 15 provides a circuit diagram for a timing circuit 1500 that provides timing signals that vary according to whether a BANKSELECT signal is selecting the near bank 1405 or the far bank 1403 (see FIG. 14). In the timing circuit 1500 a mimicked write driver 103C connects to the tracking bitline TRKBL through a wire 1501, which connects to the tracking bitline TRKBL at the far end of the tracking cell array 1302. The is the type of connection that is made in the timing circuit 100 of FIG. 1. When the mimicked write driver 103C pulls down the tracking bitline TRKBL from the far end, the speed with which the mimicked write driver 103C pulls down the tracking bitline TRKBL tracks the furthest memory cell from the IO circuit 1315 (see FIG. 14).

When the BANKSELECT signal is not asserted, the mimicked write driver 103C pulls down the tracking bitline TRKBL at the far end of the tracking cell array 1302. When the BANKSELECT signal is asserted the mimicked write driver 103C is connected to the tracking bitline TRKBL through the wire 1503 and the mimicked write driver 103C can pull down the tracking bitline TRKBL from the near end of the tracking cell array 1302. This mode of operation tracks memory cells in the near bank 1405 (see FIG. 14).

Figure 16:
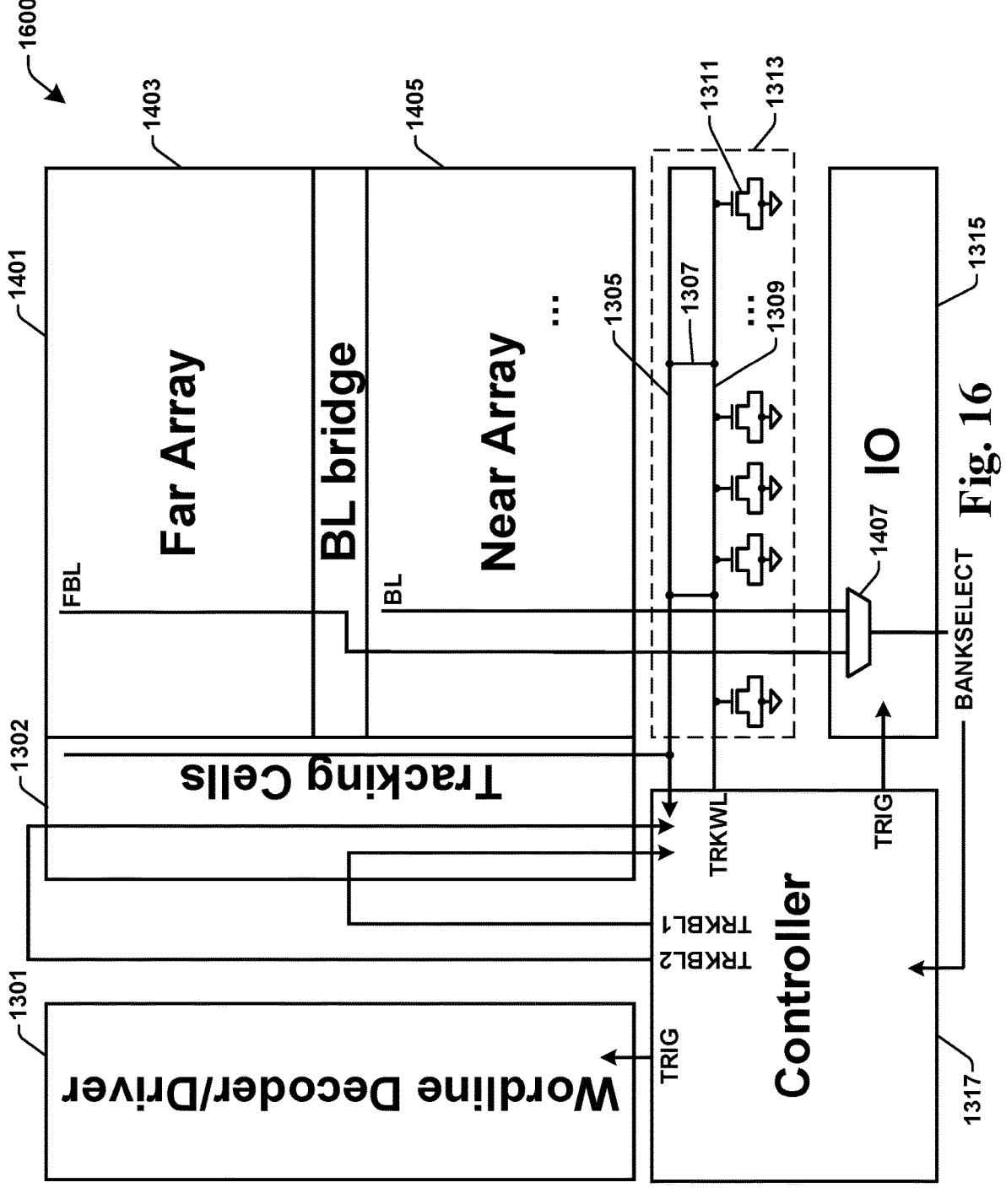
FIG. 16 illustrates a layout for a memory device according to some other embodiments.

FIG. 16 illustrates a layout of a memory device 1600 that includes another memory macro according to the present disclosure. The memory device 1600 is like the memory device 1400 of FIG. 14 except that the memory device 1600 has a first tracking bitline TRKBL1 for tracking cells in the near bank 1405 and a second tracking bitline TRKBL2 for tracking cells in the far bank 1403.

Figure 17:
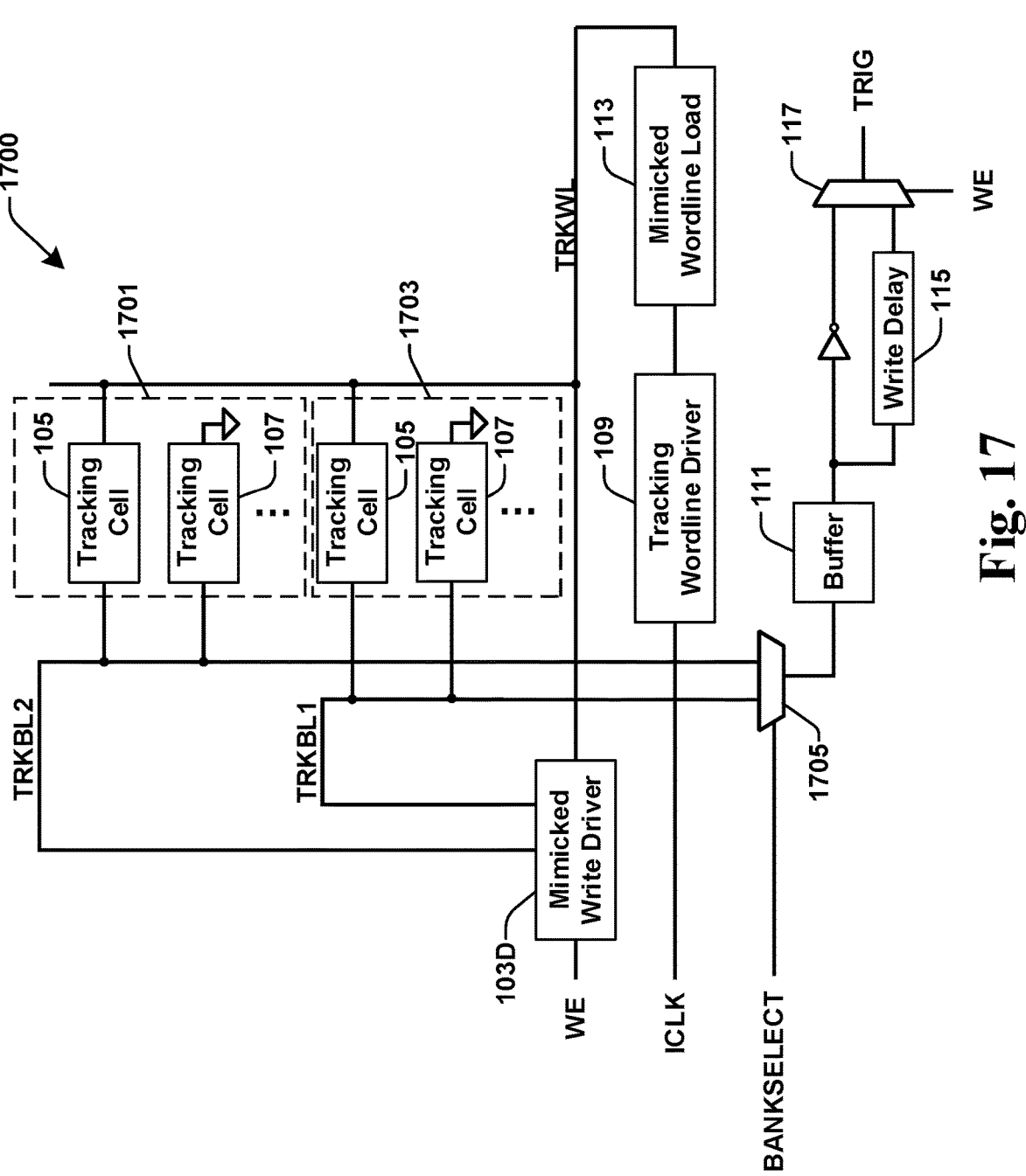
FIG. 17 is a circuit diagram for a timing circuit according to some other embodiments.

FIG. 17 provides a circuit diagram for a timing circuit 1700 for the memory device 1600 of FIG. 16. In the timing circuit 1700 the first tracking bitline TRKBL1 is connected to the tracking cells in a near array 1703 and the second tracking bitline TRKBL1 is connected to the tracking cells in a far array 1701. The timing circuit 1700 has a mimicked write driver 103D that pulls down the first tracking bitline TRKBL1 and the second tracking bitline TRKBL2 in parallel. A multiplexer 1705 selects the input to the buffer 111 from the first tracking bitline TRKBL1 and the second tracking bitline TRKBL2 according to the BANKSELECT signal.

Figure 18:
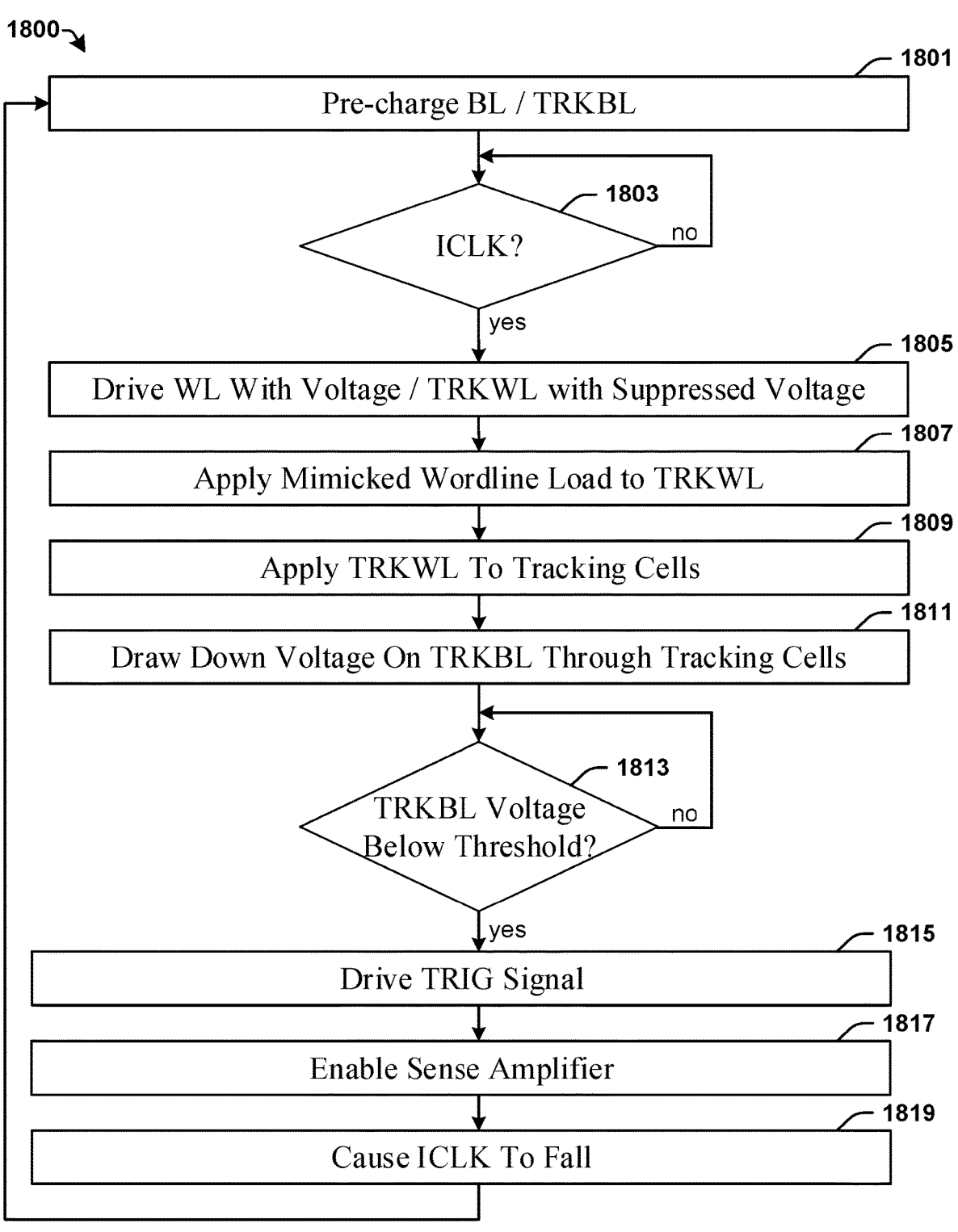
FIG. 18 is a flow chart illustrating a read tracking operation according to some embodiments.

FIG. 18 presents a flow chart for a read tracking process 1800 that may be implemented by a memory device according to the present disclosure. While the read tracking process 1800 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts are required to implement one or more aspects or embodiments of the description herein, and one or more of the acts depicted herein may be carried out in one or more separate acts and/or phases.

The process 1800 may begin with act 1801, pre-charging a tracking bitline TRKBL and a bitline BL. The tracking bitline TRKBL and the bitline BL may be pre-charged to $V_{DD}$, which is a voltage that is higher than the suppressed voltage.

Act 1803 is waiting for the ICLK signal. The ICLK signal may be trigger by a global clock signal. When the ICLK signal is asserted, the tracking bitline TRKBL may be allowed to float and the process may continue with act 1805.

Act 1805 is driving a wordline WL of a memory array with a memory drain voltage $V_{DDM}$ and driving a tracking wordline TRKWL of a timing circuit with a suppressed voltage. Driving the wordline WL initiates the read operation. The memory drain voltage $V_{DDM}$ may be the drain voltage $V_{DD}$ or may be less than the drain voltage $V_{DD}$, for example when RAS is in use. In either case the suppressed voltage is less than the memory drain voltage $V_{DDM}$. The suppressed voltage is less than the memory drain voltage $V_{DDM}$ by a predetermined amount. The predetermined amount may be a conservative estimate for the difference between the highest threshold voltage among the memory cells in the memory array and an average threshold voltage among the memory cells in the memory array. The tracking wordline driver 109 of FIG. 4 provides an example of a circuit that can apply the suppressed voltage to a drive the tracking wordline TRKWL with the suppressed voltage.

Act 1807 is applying a mimicked wordline load to the tracking wordline TRKWL. The mimicked wordline load approximates the RC delay on the wordline WL between the wordline driver and a furthest memory cell addressed by the wordline WL. The load mimicking array 1313 and the connecting wires 1307 of FIG. 13 illustrate how the resistance and the capacitance of the wordline WL may be mimicked.

Act 1809 is applying the tracking wordline TRKWL to one or more tracking cells. The tracking wordline TRKWL may be applied to the tracking cells through pass gates of the tracking cells which may be similar to the pass gates PG1 and PG2 of the memory cell 1200 of FIG. 12A.

Act 1811 is allowing the tracking cells to draw down the voltage on the tracking bitline TRKBL. Act 1813 is determining whether the tracking bitline TRKBL has fallen below a threshold voltage. The threshold voltage may be a voltage at which the output of a buffer such as the buffer 111 of FIG. 1 switches from high to low.

Act 1815 is driving the TRIG signal when the threshold voltage has been reached. The buffer may drive the TRIG signal. Act 1817 is enabling a sense amplifier in response to the TRIG signal. The sense amplifier is connected to a bitline BL for a memory cell in the memory array. There may be little or no delay between the driving of the TRIG signal and the enabling of the sense amplifier.

Act 1819 is causing the ICLK signal to fall. The TRIG signal may be used to cause the ICLK signal to fall, and the falling of the ICLK signal may be used to activate the pre-charger and begin a repetition of the process 1800.

Figure 19:
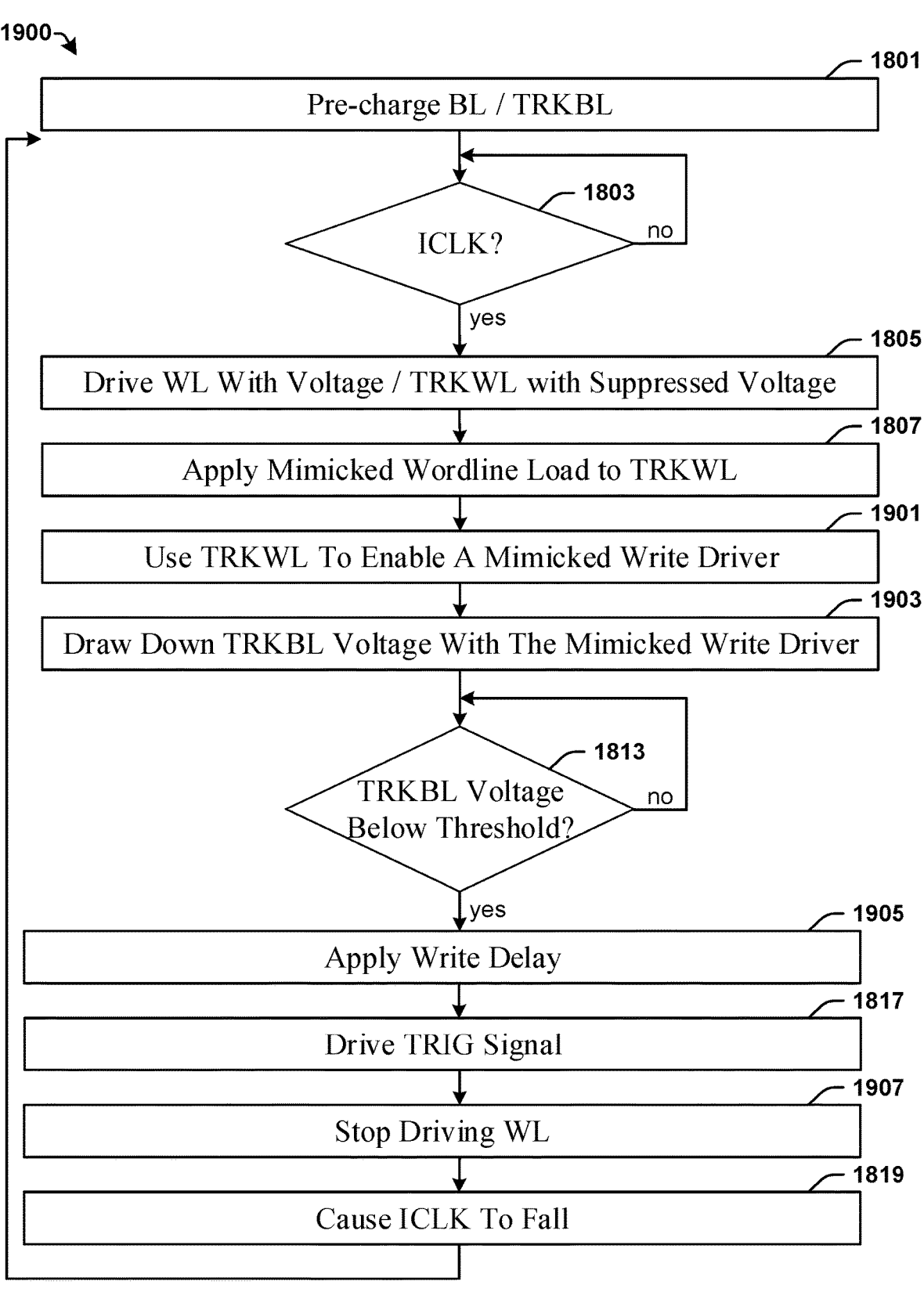
FIG. 19 is a flow chart illustrating a write tracking operation according to some embodiments.

FIG. 19 presents a flow chart for a write tracking process 1900 that may be implemented by a memory device according to the present disclosure. While the write tracking process 1900 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts are required to implement one or more aspects or embodiments of the description herein, and one or more of the acts depicted herein may be carried out in one or more separate acts and/or phases.

The write tracking process 1900 may have many of the same steps and may use many of the same circuits as the read tracking process 1800. The differences begin with act 1901, using the tracking wordline TRKWL is enable the mimicked write driver. The mimicked write driver may be enabled by the tracking wordline TRKWL conditionally according to whether a write enable signal is also asserted.

Act 1903 is drawing down the voltage on the tracking bitline TRKBL using the mimicked write driver. The mimicked write driver draws down the voltage on the tracking bitline TRKBL more quickly than do the tracking cells. It is permissible to also apply the tracking wordline TRKWL to the tracking cells during the write tracking operation.

Act 1905 is applying a write delay to a signal that is triggered by the tracking bitline TRKBL falling to the threshold voltage. FIG. 9 illustrates the write delay circuit 115A, which is an example of a circuit through which the signal may be delayed. FIG. 10 illustrates the write delay circuit 115B, which is another example of how the signal may be delayed. In the write delay circuit 115B, the delay is modulated using the suppressed voltage of the tracking wordline WL, which allows for greater accuracy. Act 1907 is ending the driving of the wordline WL, which is the conclusion of the write operation on a memory cell.

Some aspects of the present disclosure relate to a memory device that includes a memory array, a first tracking cell, and a tracking wordline driver. The tracking wordline driver comprises a switch circuit, a draw down circuit, and a node. A tracking wordline is coupled to the node and to the first tracking cell. A drain supply provides a drain voltage to the switch circuit. A source supply provides a source voltage to the draw down circuit. The tracking wordline driver couples the node to the drain supply through the switch circuit and to the source supply through the draw down circuit so as to drive the tracking wordline at a suppressed voltage which is between the drain voltage and the source voltage. In some embodiments, the draw down circuit comprises a transistor. In some embodiments, the switch circuit comprises a second transistor and the first transistor and the second transistor share a source/drain region. In some embodiments, the switch circuit comprises a plurality of second transistors having gate electrodes and arranged in parallel so that one gate strip provides the gate electrodes for all the second transistors.

In some embodiments, the first transistor is one of a plurality of first transistors connected in series. In some embodiments, the memory array comprises a large number of cells, e.g., at least 100,000 memory cells. The memory cells have pass gate transistors. The draw down circuit holds the suppressed voltage below the drain voltage by at least $\Delta V_{th}$ where $\Delta V_{th}$ is a difference between a highest threshold voltage among the pass gate transistors in the memory array and an average threshold voltage for the pass gate transistors in the memory array.

In some embodiments, the memory device further comprises a mimicked write driver and a tracking bitline. The tracking bitline is coupled to the first tracking cell. The tracking wordline is coupled to the mimicked write driver. The mimicked write driver is configured to pull down the tracking bitline if enabled by the tracking wordline. In some embodiments, the memory array comprises a near bank and a far bank. The first tracking cell is in the near bank and a second tracking cell is in the far bank. The tracking bitline is connected to the second tracking cell. The mimicked write driver has a first connection and a second connection to the tracking bitline. The first connection is a greater distance along the tracking bitline from the first tracking cell than is the second connection. The mimicked write driver has a state in which the second connection is open while the first connection is closed. In some embodiments, the memory device comprises a first tracking bitline connected to the first tracking cell and a second tracking bitline connected to the second tracking cell and a multiplexer toggles an output between a first input from the first tracking bitline and a second input from the second tracking bitline.

In some embodiments, the memory device further comprises a tracking bitline coupled to the first tracking cell. A mimicked write delay circuit coupled to the tracking wordline and the tracking bitline and is configured to assert a timing signal in response to the tracking wordline being asserted and the tracking bitline being pulled down. In some embodiments, the memory array is static random access memory (SRAM).

Some aspects of the present disclosure relate to a memory device that includes a wordline extending from an active wordline driver into a memory array and a tracking wordline extending from a tracking wordline driver to a tracking cell. The active wordline driver is configured to drive the wordline with a first voltage. The tracking wordline driver is configured to drive the tracking wordline with a second voltage that the tracking wordline driver makes systematically lower than the first voltage. In some embodiments, the tracking wordline driver is configured to divide a current between the tracking wordline and ground in a ratio predetermined by a circuit of the tracking wordline driver.

Some aspects of the present disclosure relate to a method that includes providing a memory array having rows and columns of memory cells. The memory cells have pass gates, and the pass gates have threshold voltages. A wordline is connected to the pass gates of the memory cells in one of the rows. A tracking wordline and a tracking bitline are connected to a tracking cell. The tracking wordline is driven with a suppressed voltage, which is less than a drain voltage. The wordline is driven with the drain voltage to perform a read or write operation on one of the memory cells. The tracking bitline is used to trigger a timing signal that is used in the read or write operation.

In some embodiments, the suppressed voltage is lower than the drain voltage by an amount that is at least four times a standard deviation of the threshold voltages of the pass gates of the memory cells in the memory array. In some embodiments, driving the tracking wordline with a suppressed voltage comprises driving a wordline driver with a current at or above the drain voltage and dividing the current between the tracking wordline and ground. In some embodiments, the method further includes connecting the tracking wordline to a plurality of load-mimicking gates aligned parallel to the one of the rows. In some embodiments, the tracking wordline comprises first wire, a second wire, and a connecting wire. The first wire extends from a first side of the memory array to connect with the load-mimicking gates. The second wire is parallel to the first wire. The connecting wire makes a connection between the first wire and the second wire at a location that is between two of the load-mimicking gates. The he first wire, the second wire, and the connecting wire are configured so that a current from the suppressed voltage on a driven end of the tracking wordline passes through the first wire, the connecting wire, and the second wire to reach the tracking cell. In some embodiments, a second connecting wire makes a connection between the first wire and the second wire at a second location that is between the two of the load-mimicking gates. In some embodiments the method further comprises precharging a bitline connected to the one of the memory cells to a voltage higher than the suppressed voltage.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device comprising:
a memory array;
a first tracking cell;
a tracking wordline driver comprising a switch circuit, a draw down circuit, and a node;
a tracking wordline coupled to the node and coupled to the first tracking cell;
a drain supply configured to provide a drain voltage to the switch circuit; and
a source supply configured to provide a source voltage to the draw down circuit;
wherein the tracking wordline driver couples the node to the drain supply through the switch circuit and to the source supply through the draw down circuit so as to drive the tracking wordline at a suppressed voltage which is between the drain voltage and the source voltage.

2. The memory device of claim 1, wherein the draw down circuit comprises a first transistor.

3. The memory device of claim 2, wherein:
the switch circuit comprises a second transistor; and
the first transistor and the second transistor share a source/drain region.

4. The memory device of claim 2, wherein:
the switch circuit comprises a plurality of second transistors having gate electrodes; and
the plurality of second transistors are arranged in parallel so that one gate strip provides the gate electrodes for the plurality of second transistors.

5. The memory device of claim 4, wherein the first transistor is one of a plurality of first transistors connected in series.

6. The memory device of claim 1, wherein:
the memory array comprises at least 100,000 memory cells;
the memory cells have pass gate transistors; and
the draw down circuit holds the suppressed voltage below the drain voltage by at least $\Delta V^{th}$ where $\Delta V^{th}$ is a difference between a highest threshold voltage among the pass gate transistors in the memory array and an average threshold voltage for the pass gate transistors in the memory array.

7. The memory device of claim 1, further comprising:
a mimicked write driver; and
a tracking bitline coupled to the first tracking cell;
wherein the tracking wordline is coupled to the mimicked write driver; and
the mimicked write driver is configured to pull down the tracking bitline if enabled by the tracking wordline.

8. The memory device of claim 7, wherein:
the memory array comprises a near bank and a far bank;
the first tracking cell is in the near bank and a second tracking cell is in the far bank;
the tracking bitline is connected to the second tracking cell;
the mimicked write driver has a first connection and a second connection to the tracking bitline;
the first connection is a greater distance along the tracking bitline from the first tracking cell than is the second connection; and
the mimicked write driver has a state in which the second connection is open while the first connection is closed.

9. The memory device of claim 1, wherein:
the memory array comprises a near bank and a far bank;
the first tracking cell is adjacent the near bank and a second tracking cell is adjacent the far bank;
the memory device further comprises a first tracking bitline connected to the first tracking cell and a second tracking bitline connected to the second tracking cell; and
a multiplexer toggles an output between a first input from the first tracking bitline and a second input from the second tracking bitline.

10. The memory device of claim 1, further comprising:
a tracking bitline coupled to the first tracking cell; and
a mimicked write delay circuit, wherein the mimicked write delay circuit is coupled to the tracking wordline and the tracking bitline and is configured to assert a timing signal in response to the tracking wordline being asserted and the tracking bitline being pulled down.

11. The memory device of claim 1, wherein the memory array is static random access memory (SRAM).

12. A memory device, comprising:
a wordline extending from an active wordline driver into a memory array; and
a tracking wordline extending from a tracking wordline driver to a tracking cell, wherein the tracking wordline driver is a distinct circuit from the active wordline driver, and the tracking wordline is connected to a gate electrode of a transistor in the tracking cell;
wherein the active wordline driver is configured to drive the wordline with a first voltage; and
the tracking wordline driver is configured to drive the tracking wordline with a second voltage that the tracking wordline driver makes systematically lower than the first voltage.

13. The memory device of claim 12, wherein the tracking wordline driver is configured to divide a current between the tracking wordline and ground in a ratio predetermined by a circuit of the tracking wordline driver.

14. A method, comprising:

providing a memory array having rows and columns of memory cells, wherein the memory cells have pass gates, and the pass gates have threshold voltages;

connecting a wordline to the pass gates of the memory cells in one of the rows;

connecting a tracking wordline and a tracking bitline to a tracking cell;

initiating a read operation on one of the memory cells, wherein the read operation comprises driving the wordline with a drain voltage; and driving the tracking wordline with a suppressed voltage, wherein the suppressed voltage is less than the drain voltage; and using the tracking bitline to trigger a first timing signal which is used in the read operation.

15. The method of claim 14, wherein the suppressed voltage is lower than the drain voltage by an amount that is at least four times a standard deviation of the threshold voltages of the pass gates of the memory cells in the memory array.

16. The method of claim 14, wherein driving the tracking wordline with a suppressed voltage comprises driving a wordline driver with a current at or above the drain voltage and dividing the current between the tracking wordline and ground.

17. The method of claim 14, further comprising connecting the tracking wordline to a plurality of load-mimicking gates aligned parallel to the one of the rows.

18. The method of claim 17, wherein:

the tracking wordline comprises a first wire, a second wire, and a connecting wire;

the first wire extends from a first side of the memory array to connect with the load-mimicking gates;

the second wire is parallel to the first wire;

the connecting wire makes a connection between the first wire and the second wire at a location that is between two of the load-mimicking gates; and the first wire, the second wire, and the connecting wire are configured so that a current from the suppressed voltage on a driven end of the tracking wordline passes through the first wire, the connecting wire, and the second wire to reach the tracking cell.

19. The method of claim 18, further comprising a second connecting wire that makes a connection between the first wire and the second wire at a second location that is between the two of the load-mimicking gates.

20. The method of claim 14, further comprising:

initiating a write operation on one of the memory cells, wherein the write operation comprises driving the wordline with the drain voltage;

driving the tracking wordline with the suppressed voltage; and using the tracking bitline to trigger a second timing signal which is used in the write operation.

* * * * *